United States Patent

Imada

(10) Patent No.: US 9,240,472 B2
(45) Date of Patent: Jan. 19, 2016

(54) SEMICONDUCTOR DEVICE, PFC CIRCUIT, POWER SUPPLY DEVICE, AND AMPLIFIER

(71) Applicant: FUJITSU LIMITED, Kawasaki-shi, Kanagawa (JP)

(72) Inventor: Tadahiro Imada, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 13/780,011

(22) Filed: Feb. 28, 2013

(65) Prior Publication Data

US 2013/0240953 A1    Sep. 19, 2013

(30) Foreign Application Priority Data

Mar. 19, 2012 (JP) ................... 2012-062902

(51) Int. Cl.
  *H01L 29/778*    (2006.01)
  *H01L 29/66*    (2006.01)
  (Continued)

(52) U.S. Cl.
  CPC .......... *H01L 29/778* (2013.01); *H01L 29/1066* (2013.01); *H01L 29/66462* (2013.01); *H01L 29/7787* (2013.01); *H01L 29/2003* (2013.01);
  (Continued)

(58) Field of Classification Search
  CPC .................. H01L 29/778; H03K 17/08104
  USPC .............................. 257/76, 194, 195, E29.246
  See application file for complete search history.

(56) References Cited

U.S. PATENT DOCUMENTS 5,698,888 A    12/1997 Fukaishi
7,271,429 B2 *    9/2007 Saito et al. ................. 257/197
(Continued)

FOREIGN PATENT DOCUMENTS

CN    102148227 A    8/2011
JP    08-293507 A    11/1996
(Continued)

OTHER PUBLICATIONS

Korean Office Action dated Dec. 30, 2013, in the corresponding Korean patent application No. 10-2013-24977, with English translation.

(Continued)

*Primary Examiner* — Eduardo A Rodela
*Assistant Examiner* — Vincent Wall
(74) *Attorney, Agent, or Firm* — Kratz, Quintos & Hanson, LLP

(57) ABSTRACT

A semiconductor device, that has a transistor region and a surge-protector region, includes: a substrate; a first semiconductor layer formed on the substrate; a second semiconductor layer formed on the first semiconductor layer; a gate electrode, a source electrode, and a drain electrode formed on the second semiconductor layer in the transistor region; and a surge-protector first electrode, a surge-protector second electrode, and a surge-protector third electrode formed on the second semiconductor layer in the surge-protector region, wherein the source electrode and the surge-protector second electrode are connected to each other, wherein the drain electrode and the surge-protector third electrode are connected to each other, wherein the surge-protector first electrode is formed between the surge-protector second electrode and the surge-protector third electrode, and wherein a distance between the surge-protector first electrode and the surge-protector third electrode is smaller than a distance between the gate electrode and the drain electrode.

15 Claims, 27 Drawing Sheets

(51) Int. Cl.
   *H01L 29/10* (2006.01)
   *H01L 29/417* (2006.01)
   *H01L 29/20* (2006.01)

(52) U.S. Cl.
   CPC ... *H01L 29/41758* (2013.01); *H01L 2924/0002* (2013.01)

(56) References Cited

U.S. PATENT DOCUMENTS

| | | | |
|---|---|---|---|
| 7,498,617 B2 * | 3/2009 | Kinzer | 257/192 |
| 2006/0043501 A1 | 3/2006 | Saito et al. | |
| 2006/0273347 A1 | 12/2006 | Hikita et al. | |
| 2008/0277692 A1 | 11/2008 | Saito et al. | |
| 2009/0045439 A1 | 2/2009 | Hoshi et al. | |
| 2009/0166677 A1 | 7/2009 | Shibata et al. | |
| 2011/0193171 A1 | 8/2011 | Yamagiwa et al. | |
| 2011/0254056 A1 | 10/2011 | Machida et al. | |
| 2013/0087762 A1 * | 4/2013 | Hung et al. | 257/13 |

FOREIGN PATENT DOCUMENTS

| | | |
|---|---|---|
| JP | 2002-359256 A1 | 12/2002 |
| JP | 2008-277641 | 11/2008 |
| JP | 2009-049121 A | 3/2009 |
| JP | 2009-164158 A | 7/2009 |
| JP | 2011-30396 A1 | 2/2011 |
| JP | 2011-165749 | 8/2011 |
| JP | 2011-228398 A | 11/2011 |
| JP | 2012-064672 A | 3/2012 |

OTHER PUBLICATIONS

Office Action of Counterpart Chinese Patent Application No. 201310073039.1 dated Apr. 23, 2015.

Office Action of Counterpart Japanese Patent Application No. 2012-062902 dated Nov. 4, 2015 with Partial Translation.

* cited by examiner

SEMICONDUCTOR DEVICE, PFC CIRCUIT, POWER SUPPLY DEVICE, AND AMPLIFIER

CROSS-REFERENCE TO RELATED APPLICATION(S)

This application is based upon and claims the benefit of priority of the prior Japanese Patent Application No. 2012-062902, filed on Mar. 19, 2012, the entire contents of which are incorporated herein by reference.

FIELD

The embodiments discussed herein are related to a semiconductor device, a power factor correction (PFC) circuit, a power supply device, and an amplifier.

BACKGROUND

Gallium nitride (GaN), aluminum nitride (AlN), and indium nitride (InN), which are nitride semiconductors, or a material, which is mixed crystal thereof, have a wide band gap, and are used for a high-power electronic device, a short-wave light-emitting device, etc. For example, GaN, which is a nitride semiconductor, has a band gap of 3.4 eV that is larger than a band gap of 1.1 eV of silicon (Si) and a band gap of 1.4 eV of gallium arsenide (GaAs).

The high-power electronic device may be a field effect transistor (FET), or more particularly, a high-electron-mobility transistor (HEMT). The HEMT using the nitride semiconductor is used for a high-power high-efficiency amplifier, a high-power switching device, etc. More specifically, in an HEMT, in which aluminum gallium nitride (AlGaN) is used for an electron supply layer and GaN is used for a transit layer, a difference in lattice constant between AlGaN and GaN causes a distortion, resulting in that piezoelectric polarization and spontaneous polarization occur in AlGaN, and high-density two-dimensional electron gas (2DEG) is generated. Hence, an operation with a high voltage is available. The HEMT may be used for a high-efficiency switching element, and a high breakdown voltage power device for an electric vehicle etc.

Japanese Laid-open Patent Publication No. 2002-359256 and No. 2011-030396 are examples of related art.

A field effect transistor using silicon as a semiconductor material spontaneously contains a body diode. The body diode is connected to the transistor by anti-parallel connection. Hence, even if a high surge voltage is generated, an avalanche decay occurs. Thus a sufficient surge resistance is provided. However, a GaN-base HEMT does not spontaneously contain the body diode. If a high surge voltage is generated, the HEMT may be broken and a failure or the like may occur. Hence, a surge protector, such as a varistor or a resistance-capacitance (RC) surge absorption circuit, has to be additionally provided.

The surge protector typically has a large parasitic capacity. When the HEMT etc. is operated, heat is generated, and the temperature is increased. The increase in temperature decreases the operation efficiency and operation speed. Owing to this, a switching loss is generated when the surge protector is used for the switching element. Also, even when the HEMT is normally operated, flow-through current likely flows in the surge protector, and power consumption tends to be increased. Further, the operation speed of the HEMT is higher than the operation speed of the surge protector.

Even when the surge protector is provided, current flows in the HEMT before current flows in the surge protector. The HEMT may be broken.

SUMMARY

According to an aspect of the invention, a semiconductor device, that has a transistor region and a surge-protector region, includes: a substrate; a first semiconductor layer formed on the substrate; a second semiconductor layer formed on the first semiconductor layer; a gate electrode, a source electrode, and a drain electrode formed on the second semiconductor layer in the transistor region; and a surge-protector first electrode, a surge-protector second electrode, and a surge-protector third electrode formed on the second semiconductor layer in the surge-protector region, wherein the source electrode and the surge-protector second electrode are connected to each other, wherein the drain electrode and the surge-protector third electrode are connected to each other, wherein the surge-protector first electrode is formed between the surge-protector second electrode and the surge-protector third electrode, and wherein a distance between the surge-protector first electrode and the surge-protector third electrode is smaller than a distance between the gate electrode and the drain electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments are described below. Like reference signs refer to like members, and the description thereof is omitted.

First Embodiment

Semiconductor Device

Figure 1:
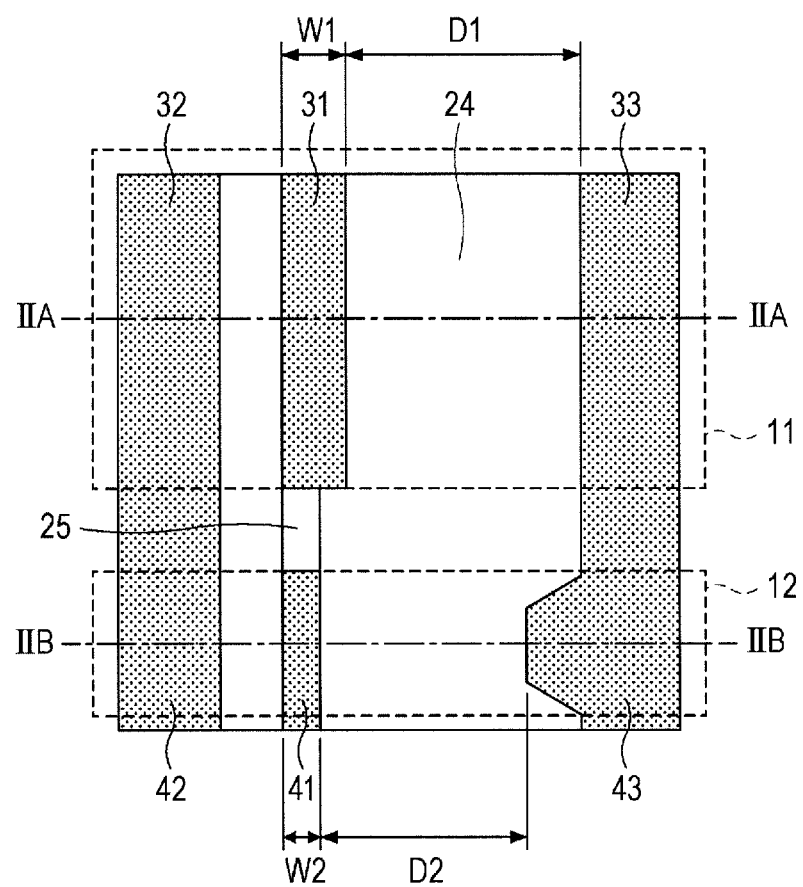
FIG. 1 is a top view of a semiconductor device according to a first embodiment.
Figure 2A:
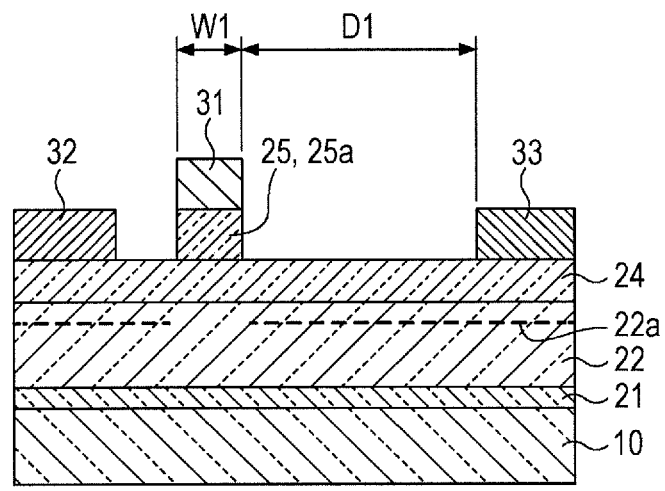
FIGS. 2A and 2B are each a cross-sectional view of the semiconductor device according to the first embodiment.
Figure 2B:
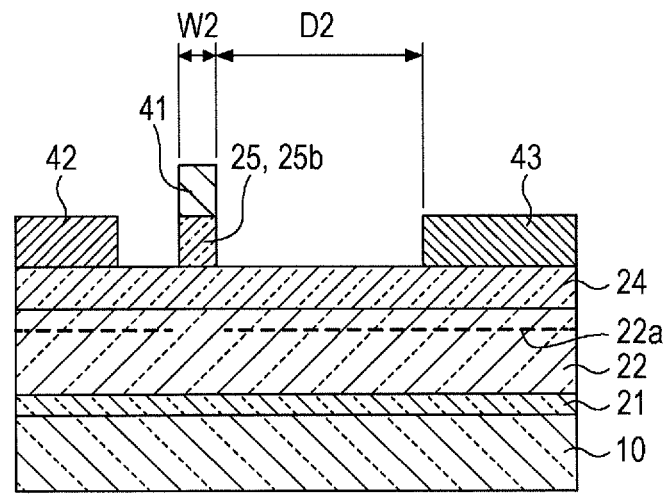

A semiconductor device according to a first embodiment is described with reference to FIGS. 1, and 2A and 2B. FIG. 1 is a top view of the semiconductor device according to this embodiment. FIG. 2A is a cross-sectional view cut along dot-dash line IIA-IIA in FIG. 1. FIG. 2B is a cross-sectional view cut along dot-dash line IIB-IIB in FIG. 1. The semiconductor device according this embodiment includes a transistor called HEMT formed therein, and has a transistor region 11 that functions as a transistor and a surge-protector region 12 that functions as a surge protector.

The semiconductor device according to this embodiment includes a substrate 10; also includes a buffer layer 21, an electron transit layer 22, and an electron supply layer 24, which are formed of nitride semiconductors, and which are laminated on the substrate 10; and further includes a p-type layer 25 formed on the electron supply layer 24. The buffer layer 21 is formed of, for example, AlN. The electron transit layer 22 is formed of, for example, intrinsic GaN (i-GaN). The electron supply layer 24 is formed of, for example, n-type AlGaN (n-AlGaN). Hence, 2DEG 22a is formed in the electron transit layer 22, at a position near the interface between the electron transit layer 22 and the electron supply layer 24. The 2DEG 22a formed as described above is generated in accordance with a difference in lattice constant between the electron transit layer 22 formed of GaN and the electron supply layer 24 formed of AlGaN. The semiconductor device according to this embodiment may have a structure in which a cap layer (not illustrated) is formed on the electron supply layer 24. Also, an intermediate layer formed of, for example, intrinsic AlGaN (i-AlGaN) may be provided between the electron transit layer 22 and the electron supply layer 24. In this case, the 2DEG 22a may be formed in the intermediate layer.

The substrate 10 may use a substrate formed of, for example, silicon, sapphire, GaAs, silicon carbide (SiC), or GaN. In this embodiment, a substrate formed of silicon is used. Also, the material forming the substrate 10 may be a semi-insulating material or a conductive material.

The p-type layer 25 is formed in the transistor region 11 and the surge-protector region 12. For the convenience of description, the p-type layer 25 formed in the transistor region 11 is called p-type layer 25a and the p-type layer 25 formed in the surge-protector region 12 is called p-type layer 25b. The p-type layer 25a and the p-type layer 25b are connected to each other and are integrally provided.

In the transistor region 11, the p-type layer 25a is formed in a region where a gate electrode 31 is formed. The gate electrode 31 is formed on the p-type layer 25a. Also, a source electrode 32 and a drain electrode 33 are formed on the electron supply layer 24 in the transistor region 11.

Also, regarding the surge-protector region 12, the p-type layer 25b is formed in a region where a surge-protector first electrode 41 is formed. The surge-protector first electrode 41 is formed on the p-type layer 25b. As described above, the p-type layer 25a and the p-type layer 25b are connected to each other and are integrally provided, thereby forming the p-type layer 25. However, the surge-protector first electrode 41 is not directly electrically connected to the gate electrode 31. Also, a surge-protector second electrode 42 and a surge-protector third electrode 43 are formed on the electron supply layer 24 in the surge-protector region 12. The surge-protector second electrode 42 is electrically connected to the source electrode 32. The surge-protector third electrode 43 is electrically connected to the drain electrode 33.

In this embodiment, a width W2 of the surge-protector first electrode 41 is smaller than a width W1 of the gate electrode 31. A width of the p-type layer 25b in the surge-protector region 12 is smaller than a width of the p-type layer 25a in the transistor region 11, correspondingly. Since the width W2 of the surge-protector first electrode 41 is smaller than the width W1 of the gate electrode 31, a short-channel effect is obtained, and hence a threshold voltage in the surge-protector region 12 may be lowered. In this embodiment, for the convenience of description, the width W2 may be called gate length of the surge-protector first electrode 41, and the width W1 may be called gate length of the gate electrode 31.

Also, a distance D2 between the surge-protector first electrode 41 and the surge-protector third electrode 43 in the surge-protector region 12 is smaller than a distance D1 between the gate electrode 31 and the drain electrode 33 in the transistor region 11. Since the distance D2 is smaller than the distance D1, if a surge voltage is generated, current flows in the surge-protector region 12 before current flows in the transistor region 11.

In this embodiment, the electron transit layer 22 may be called first semiconductor layer, the electron supply layer 24 may be called second semiconductor layer, and the p-type layer 25 may be called third semiconductor layer.

Figure 3:
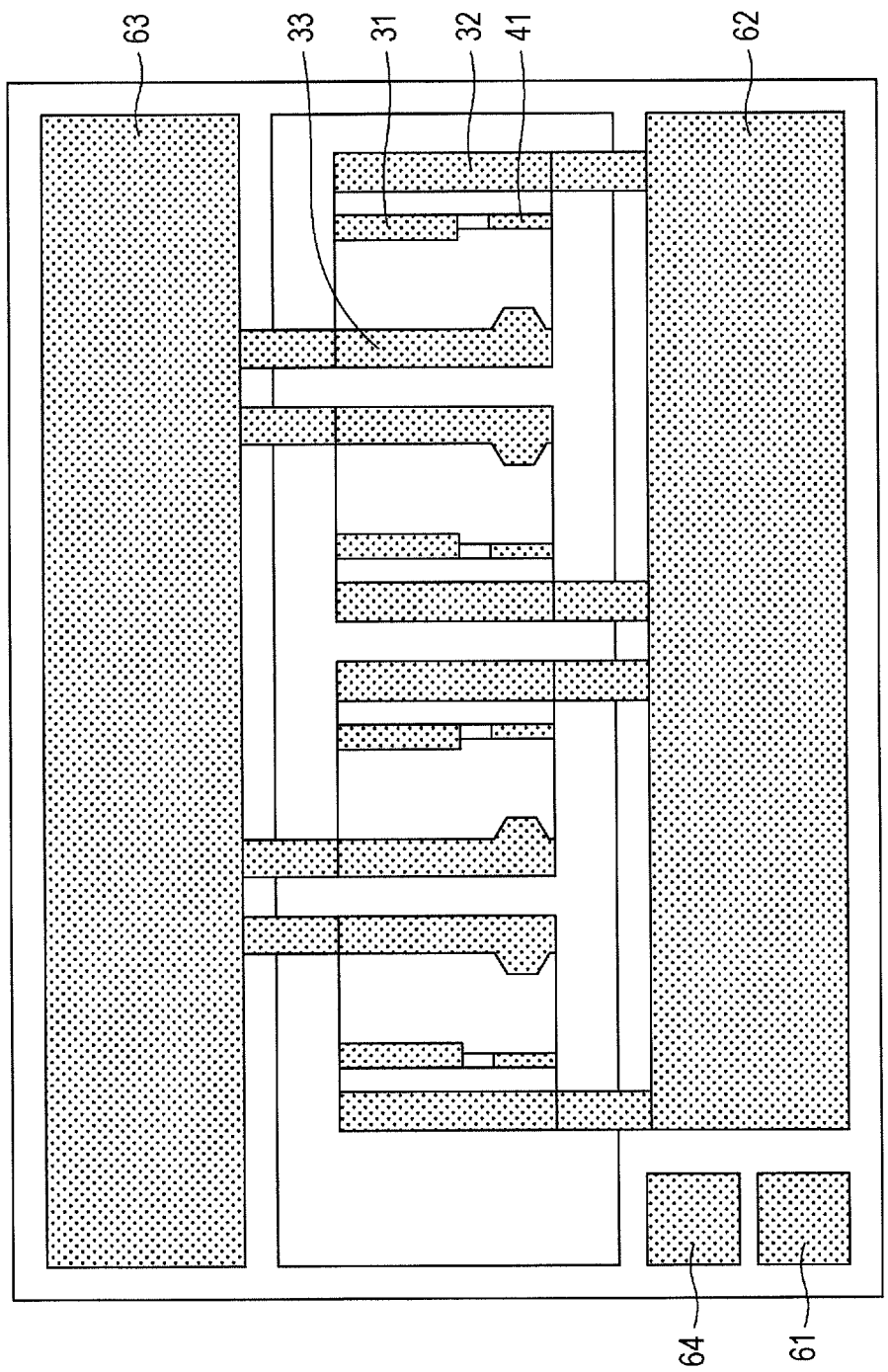
FIG. 3 is an explanatory view of the semiconductor device according to the first embodiment.

FIG. 3 illustrates a plurality of semiconductor devices according to this embodiment. More specifically, the source electrode 32 is connected to a source electrode pad 62, the drain electrode 33 is connected to a drain electrode pad 63, and the gate electrode 31 is connected to a gate electrode pad 61 through, for example, wiring (not illustrated). Also, the surge-protector first electrode 41 is connected to a surge-protector electrode pad 64 through, for example, wiring (not illustrated).

Manufacturing Method of Semiconductor Device

Next, a manufacturing method of the semiconductor device according to this embodiment is described with reference to FIGS. 4A to 7C. The semiconductor device that is described with the manufacturing method of the semiconductor device has a structure in which an intermediate layer 23 is provided between the electron transit layer 22 and the electron supply layer 24.

Figure 4A:
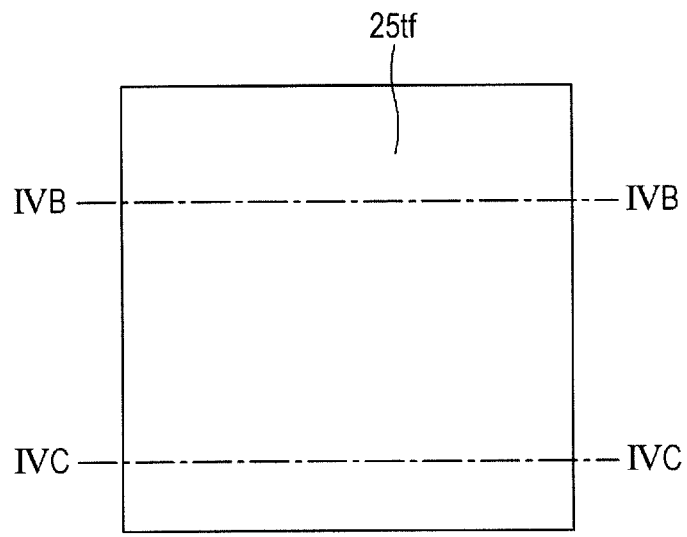
FIGS. 4A to 4C are each a process chart (1) of a manufacturing method of the semiconductor device according to the first embodiment.
Figure 4B:
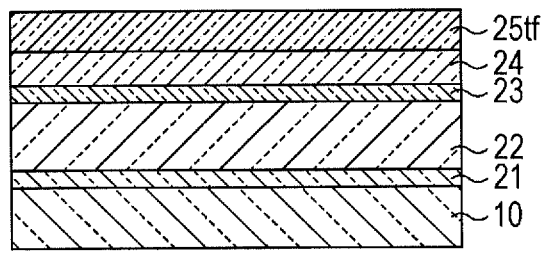
Figure 4C:
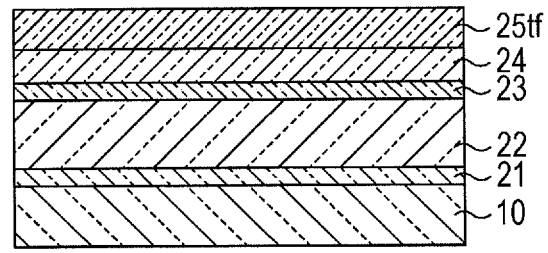

First, as illustrated in FIGS. 4A to 4C, nitride semiconductor layers respectively formed of, for example, the buffer layer 21, the electron transit layer 22, the intermediate layer 23, the electron supply layer 24, and a p-type film 25tf, are formed on the substrate 10 by a metal-organic vapor phase epitaxy (MOVPE) method. The nitride semiconductor layers are formed by epitaxial growth of the MOVPE. Alternatively, the nitride semiconductor layers may be formed by a method other than the MOVPE, for example, a molecular beam epitaxy (MBE) method. The substrate 10 uses a silicon substrate. The buffer layer 21 is formed of AlN with a thickness of 0.1 µm. The electron transit layer 22 is formed of i-GaN with a thickness of 3 µm. The intermediate layer 23 is formed of i-AlGaN with a thickness of 5 nm. The electron supply layer 24 is formed of n-AlGaN with a thickness of 30 nm. The p-type film 25tf is formed of p-type GaN (p-GaN) with a thickness of 100 nm. The p-type film 25tf is provided to form the p-type layer 25 described later. Also, the structure may include a cap layer (not illustrated) formed on the electron supply layer 24.

In this embodiment, when AlN, GaN, and AlGaN are formed by the MOVPE, gas of, for example, trimethylamine (TMA) serving as a source of aluminum (Al), trymethylgallium (TMG) serving as a source of gallium (Ga), and ammonia (NH$_3$) serving as a source of nitrogen (N), are used as source gas. The layers of AlN, GaN, and AlGaN being the nitride semiconductor layers may be each deposited by mixing the above-described source gas with a predetermined ratio in accordance with the composition of each of the nitride semiconductor layers and supplying the mixed source gas. When the nitride semiconductor layers are formed by the MOVPE for the semiconductor device according to this embodiment, the flow rate of the ammonia gas is in a range from 100 ccm to 10 LM. The pressure in the device during the deposition is in a range from 50 to 300 Torr. The grow temperature is in a range from 1000° C. to 1200° C.

Also, n-AlGaN which becomes the electron supply layer 24 is doped with Si as an impurity element which becomes n-type. More specifically, the electron supply layer 24 may be doped with Si by adding SiH$_4$ gas to the source gas at a predetermined flow rate when the electron supply layer 24 is deposited. The density of Si doped in n-AlGaN thus formed is in a range from $1\times10^{18}$ cm$^{-3}$ to $1\times10^{20}$ cm$^{-3}$, and is, for example, about $5\times10^{18}$ cm$^{-3}$. Even when, for example, n-type GaN (n-GaN) is formed as the cap layer (not illustrated), n-GaN may be formed by a method like the above-described method.

Also, p-GaN forming the p-type film 25tf is doped with magnesium (Mg) as an impurity element which becomes p-type. The density of doped Mg is in a range from $1\times10^{20}$ cm$^{-3}$ to $1\times10^{22}$ cm$^{-3}$, or, for example, about $1\times10^{21}$ cm$^{-3}$. Further, after the p-type film 25tf is deposited, annealing is performed at 700° C. for 30 minutes for activation. FIG. 4A is a top view of this process. FIG. 4B is a cross-sectional view cut along dot-dash line IVB-IVB in FIG. 4A. FIG. 4C is a cross-sectional view cut along dot-dash line IVC-IVC in FIG. 4A.

Figure 5A:
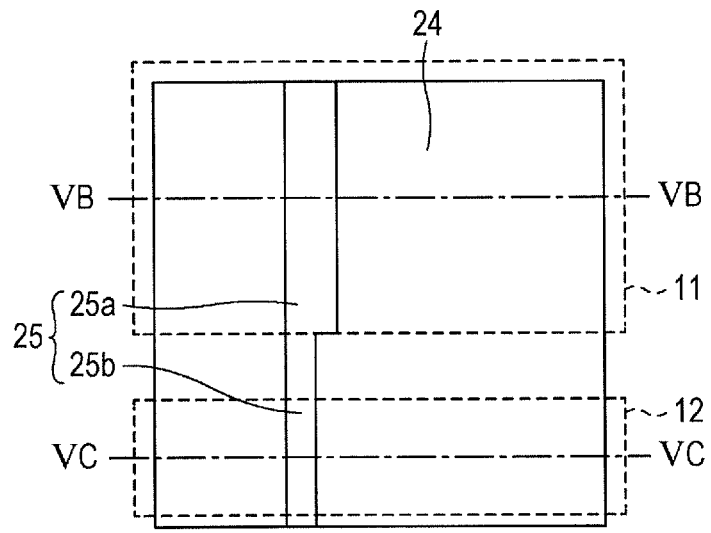
FIGS. 5A to 5C are each a process chart (2) of the manufacturing method of the semiconductor device according to the first embodiment.
Figure 5B:
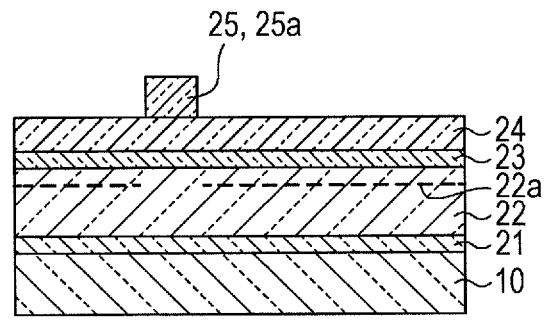
Figure 5C:
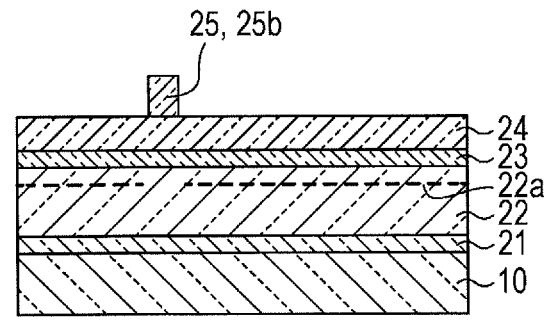

Then, as illustrated in FIGS. 5A to 5C, the p-type film 25tf is processed and thus the p-type layer 25 is formed. More specifically, a photoresist is applied on the p-type film 25tf, and the photoresist is exposed to light and developed by an exposure device. Hence, a resist pattern (not illustrated) is formed in a region where the p-type layer 25 is formed. Then, dry etching such as reactive ion etching (RIE) is performed. Hence, the p-type film 25tf in a region where the resist pattern is not formed is removed, the surface of the electron supply layer 24 is exposed, and thus the p-type layer 25 is formed of p-GaN. Then, the resist pattern (not illustrated) is removed by, for example, an organic solvent. Accordingly, the p-type layer 25 is formed in the transistor region 11 and the surge-protector region 12. As described above, the p-type layer 25 is formed such that the width of the p-type layer 25b formed in the surge-protector region 12 is smaller than the width of the p-type layer 25a formed in the transistor region 11. FIG. 5A is a top view of this process. FIG. 5B is a cross-sectional view cut along dot-dash line VB-VB in FIG. 5A. FIG. 5C is a cross-sectional view cut along dot-dash line VC-VC in FIG. 5A.

Figure 6A:
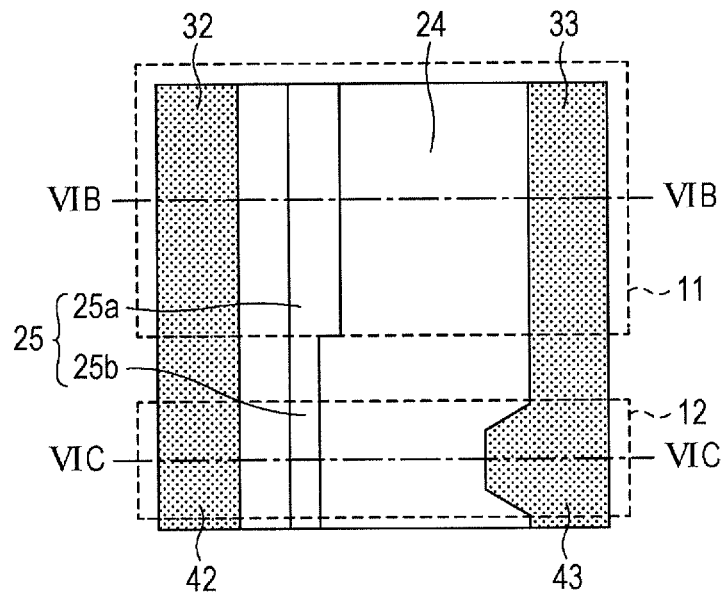
FIGS. 6A to 6C are each a process chart (3) of the manufacturing method of the semiconductor device according to the first embodiment.
Figure 6B:
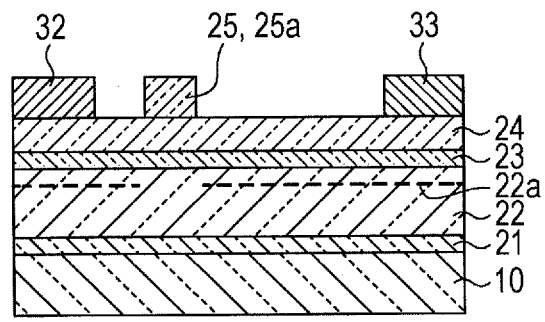
Figure 6C:
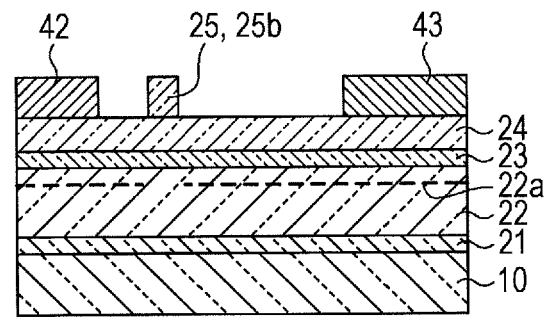

Then, as illustrated in FIGS. 6A to 6C, the source electrode 32 and the drain electrode 33 are formed on the electron supply layer 24 in the transistor region 11. The surge-protector second electrode 42 and the surge-protector third electrode 43 are formed on the electron supply layer 24 in the surge-protector region 12. More specifically, a photoresist is applied on the electron supply layer 24 and the p-type layer 25, and the photoresist is exposed to light and developed by an exposure device. Hence, a resist pattern (not illustrated) is formed. The resist pattern (not illustrated) has openings in regions where the source electrode 32, the drain electrode 33, the surge-protector second electrode 42, and the surge-protector third electrode 43 are formed. Then, a metal film which forms the source electrode 32, the drain electrode 33, etc., is deposited by vacuum deposition, and immersed in, for example, an organic solvent. Hence, the metal film deposited on the resist pattern is removed together with the resist pattern by lift-off. Accordingly, the remaining metal film forms the source electrode 32, the drain electrode 33, the surge-protector second electrode 42, and the surge-protector third electrode 43. More specifically, the source electrode 32 and the surge-protector second electrode 42 are connected to each other, and are formed of the same metal material as an integrated part. The drain electrode 33 and the surge-protector third electrode 43 are connected to each other, and are formed of the same metal material as an integrated part. In this embodiment, the surge-protector third electrode 43 has a shape which protrudes to the side provided with the p-type layer 25b. FIG. 6A is a top view of this process. FIG. 6B is a cross-sectional view cut along dot-dash line VIB-IVB in FIG. 6A. FIG. 6C is a cross-sectional view cut along dot-dash line VIC-VIC in FIG. 6A.

Figure 7A:
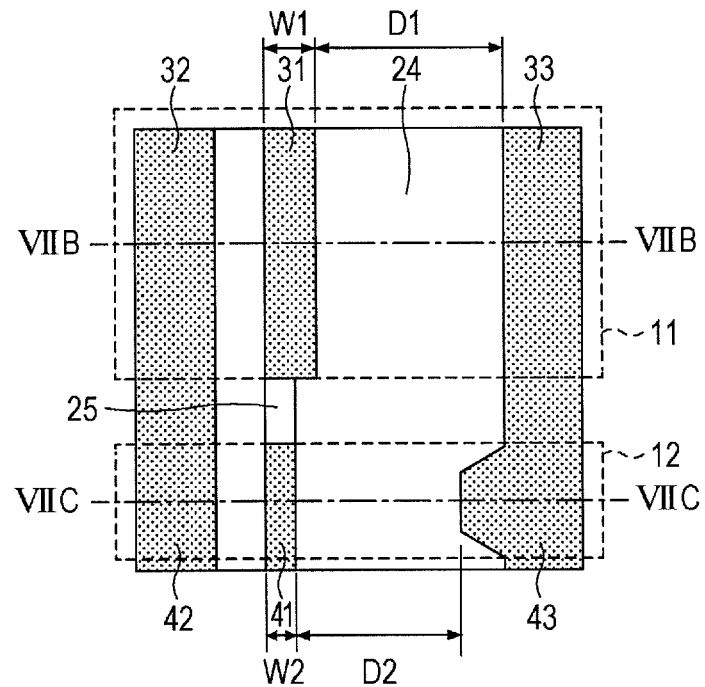
FIGS. 7A to 7C are each a process chart (4) of the manufacturing method of the semiconductor device according to the first embodiment.
Figure 7B:
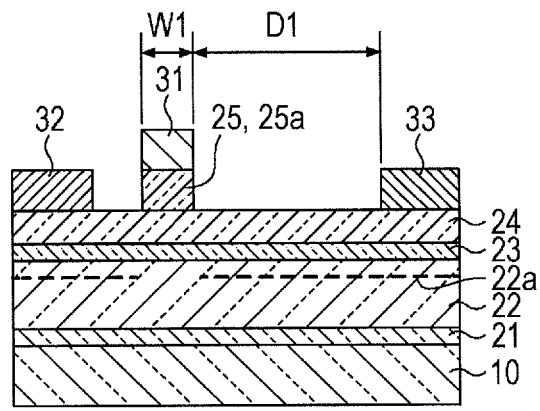
Figure 7C:
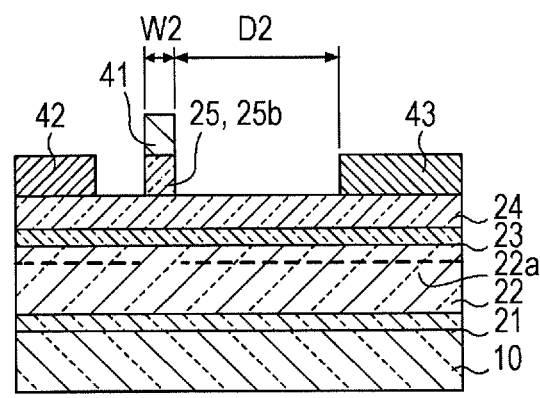

Then, as illustrated in FIGS. 7A to 7C, the gate electrode 31 is formed on the p-type layer 25 in the transistor region 11. The surge-protector first electrode 41 is formed on the p-type layer 25 in the surge-protector region 12. More specifically, a photoresist is applied on the electron supply layer 24 and the p-type layer 25, and the photoresist is exposed to light and developed by an exposure device. Hence, a resist pattern (not illustrated) is formed, the resist pattern having openings in regions where the gate electrode 31 and the surge-protector first electrode 41 are formed. Then, a metal film which forms the gate electrode 31 and the surge-protector first electrode 41 is deposited by vacuum deposition, and immersed in, for example, an organic solvent. Hence, the metal film deposited on the resist pattern is removed together with the resist pattern by lift-off. Accordingly, the remaining metal film forms the gate electrode 31 and the surge-protector first electrode 41. The gate electrode 31 and the surge-protector first electrode 41 formed as described above are not directly connected to each other, and are separated from each other. The width W2 of the surge-protector first electrode 41 is smaller than the width W1 of the gate electrode 31. Also, the distance D2 between the surge-protector first electrode 41 and the surge-protector third electrode 43 is smaller than the distance D1 between the gate electrode 31 and the drain electrode 33. FIG. 7A is a top view of this process. FIG. 7B is a cross-sectional view cut along dot-dash line VIIB-VIIB in FIG. 7A. FIG. 7C is a cross-sectional view cut along dot-dash line VIIC-VIIC in FIG. 7A.

The semiconductor device according to this embodiment is fabricated by the above-described manufacturing method. Additionally, an insulating film (not illustrated) may be formed on the gate electrode 31, the source electrode 32, the drain electrode 33, etc. This insulating film serves as a passivation film. The insulating film may be formed by depositing an insulating material, such as silicon dioxide ($SiO_2$) or silicon nitride (SiN), by, for example, plasma chemical vapor deposition (CVD).

As described above, the semiconductor device may be manufactured by the manufacturing method of the semiconductor device according to this embodiment.

Second Embodiment

Semiconductor Device

Figure 8:
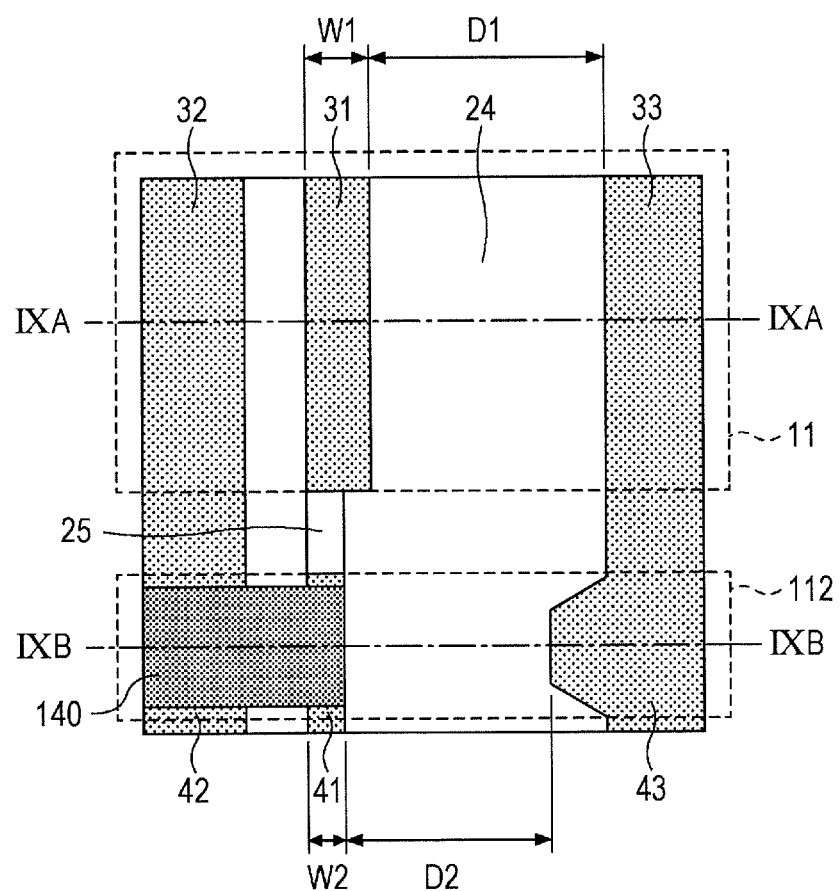
FIG. 8 is a top view of a semiconductor device according to a second embodiment.
Figure 9A:
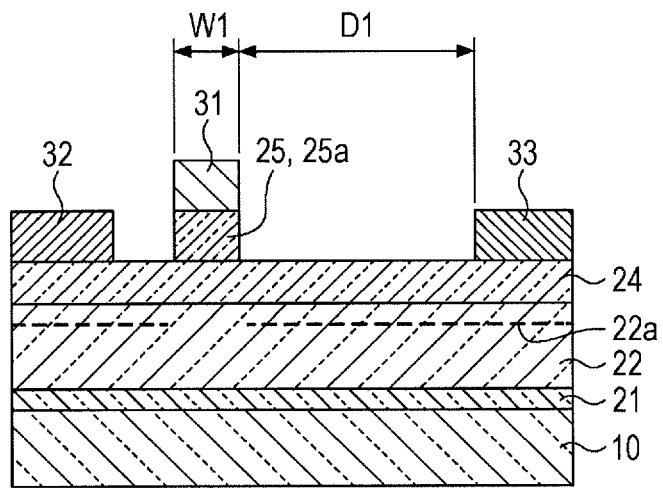
FIGS. 9A and 9B are each a cross-sectional view of the semiconductor device according to the second embodiment.
Figure 9B:
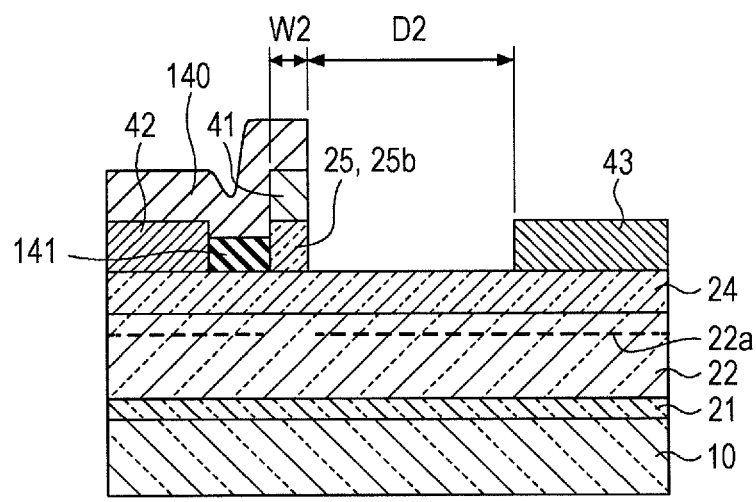

Next, a semiconductor device according to a second embodiment is described with reference to FIGS. 8, and 9A and 9B. FIG. 8 is a top view of the semiconductor device according to this embodiment. FIG. 9A is a cross-sectional view cut along dot-dash line IXA-IXA in FIG. 8. FIG. 9B is a cross-sectional view cut along dot-dash line IXB-IXB in FIG. 8. The semiconductor device according this embodiment includes a transistor called HEMT formed therein, and has a transistor region 11 that functions as a transistor and a surge-protector region 112 that functions as a surge protector.

The semiconductor device according to this embodiment includes a substrate 10; also includes a buffer layer 21, an electron transit layer 22, and an electron supply layer 24, which are formed of nitride semiconductors, and which are laminated on the substrate 10; and further includes a p-type layer 25 formed on the electron supply layer 24. The buffer layer 21 is formed of, for example, AlN. The electron transit layer 22 is formed of, for example, i-GaN. The electron supply layer 24 is formed of, for example, n-AlGaN. Hence, 2DEG 22a is formed in the electron transit layer 22, at a position near the interface between the electron transit layer 22 and the electron supply layer 24. The 2DEG 22a formed as described above is generated in accordance with a difference in lattice constant between the electron transit layer 22 formed of GaN and the electron supply layer 24 formed of AlGaN. The semiconductor device according to this embodiment may have a structure in which a cap layer (not illustrated) is formed on the electron supply layer 24. Also, an intermediate layer formed of, for example, i-AlGaN may be provided between the electron transit layer 22 and the electron supply layer 24. In this case, the 2DEG 22a may be formed in the intermediate layer.

The substrate 10 may use a substrate formed of, for example, silicon, sapphire, GaAs, SiC, or GaN. In this embodiment, a substrate formed of silicon is used. Also, the material forming the substrate 10 may be a semi-insulating material or a conductive material.

The p-type layer 25 is formed in the transistor region 11 and the surge-protector region 112. For the convenience of description, the p-type layer 25 formed in the transistor region 11 is called p-type layer 25a and the p-type layer 25 formed in the surge-protector region 112 is called p-type layer 25b. The p-type layer 25a and the p-type layer 25b are connected to each other and are integrally provided.

In the transistor region 11, the p-type layer 25a is formed in a region where a gate electrode 31 is formed. The gate electrode 31 is formed on the p-type layer 25a. Also, a source electrode 32 and a drain electrode 33 are formed on the electron supply layer 24 in the transistor region 11.

Also, regarding the surge-protector region 112, the p-type layer 25b is formed in a region where a surge-protector first electrode 41 is formed. The surge-protector first electrode 41 is formed on the p-type layer 25b. As described above, the p-type layer 25a and the p-type layer 25b are connected to each other and are integrally provided, thereby forming the p-type layer 25. However, the surge-protector first electrode 41 is not directly electrically connected to the gate electrode 31. Also, a surge-protector second electrode 42 and a surge-protector third electrode 43 are formed on the electron supply layer 24 in the surge-protector region 112. The surge-protector second electrode 42 is electrically connected to the source electrode 32. The surge-protector third electrode 43 is electrically connected to the drain electrode 33.

In this embodiment, the surge-protector first electrode 41 and the surge-protector second electrode 42 are connected to each other by a wiring layer 140 formed of a conductive metal material. Accordingly, the surge-protector first electrode 41, the surge-protector second electrode 42, and the source electrode 32 in the transistor region 11 are electrically connected to one another. The surge-protector first electrode 41 and the surge-protector second electrode 42 are at the same potential. It is to be noted that an insulating film 141 is formed between the electron supply layer 24 and the wiring layer 140.

Also, a width W2 of the surge-protector first electrode 41 is smaller than a width W1 of the gate electrode 31. A width of the p-type layer 25b in the surge-protector region 112 is smaller than a width of the p-type layer 25a in the transistor region 11, correspondingly.

Also, a distance D2 between the surge-protector first electrode 41 and the surge-protector third electrode 43 in the surge-protector region 112 is smaller than a distance D1 between the gate electrode 31 and the drain electrode 33 in the transistor region 11. Since the distance D2 is smaller than the distance D1, if a surge voltage is generated, current flows in the surge-protector region 112 before current flows in the transistor region 11.

In this embodiment, the electron transit layer 22 may be called first semiconductor layer, the electron supply layer 24 may be called second semiconductor layer, and the p-type layer 25 may be called third semiconductor layer.

Figure 10:
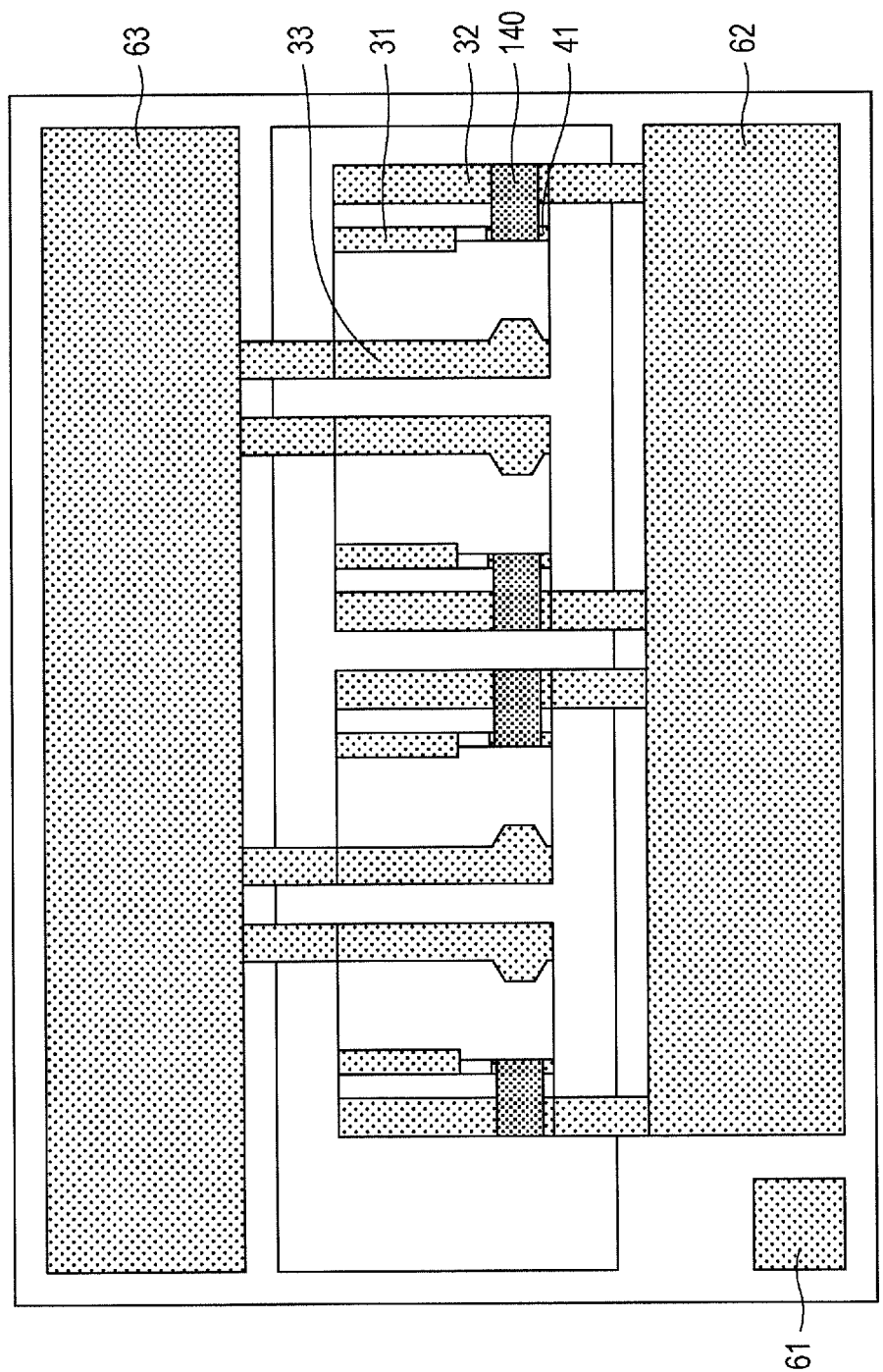
FIG. 10 is an explanatory view of the semiconductor device according to the second embodiment.

FIG. 10 illustrates a plurality of semiconductor devices according to this embodiment. More specifically, the source electrode 32 is connected to a source electrode pad 62, the drain electrode 33 is connected to a drain electrode pad 63, and the gate electrode 31 is connected to a gate electrode pad 61 through, for example, wiring (not illustrated).

Manufacturing Method of Semiconductor Device

Next, a manufacturing method of the semiconductor device according to this embodiment is described with reference to FIGS. 11A to 14C. The semiconductor device that is described with the manufacturing method of the semiconductor device has a structure in which an intermediate layer 23 is provided between the electron transit layer 22 and the electron supply layer 24.

Figure 11A:
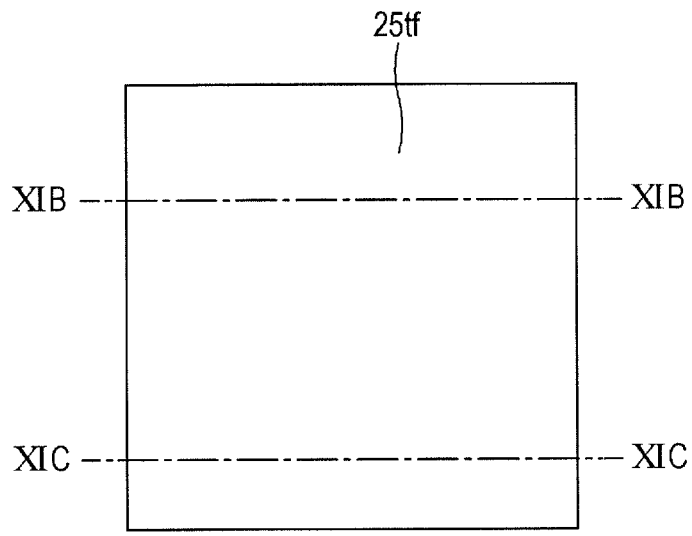
FIGS. 11A to 11C are each a process chart (1) of a manufacturing method of the semiconductor device according to the second embodiment.
Figure 11B:
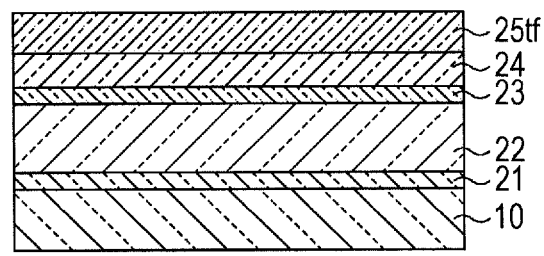
Figure 11C:
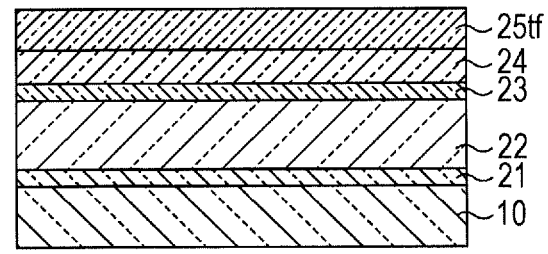

First, as illustrated in FIGS. 11A to 11C, nitride semiconductor layers respectively formed of, for example, the buffer layer 21, the electron transit layer 22, the intermediate layer 23, the electron supply layer 24, and a p-type film 25tf, are formed on the substrate 10 by the MOVPE method. The nitride semiconductor layers are formed by epitaxial growth of the MOVPE. Alternatively, the nitride semiconductor layers may be formed by a method other than the MOVPE, for example, the MBE method. The substrate 10 uses a silicon substrate. The buffer layer 21 is formed of AlN with a thickness of 0.1 μm. The electron transit layer 22 is formed of i-GaN with a thickness of 3 μm. The intermediate layer 23 is formed of i-AlGaN with a thickness of 5 nm. The electron supply layer 24 is formed of n-AlGaN with a thickness of 30 nm. The p-type film 25tf is formed of p-GaN with a thickness of 100 nm. The p-type film 25tf is provided to form the p-type layer 25 described later. Also, the structure may include a cap layer (not illustrated) formed on the electron supply layer 24.

In this embodiment, when AlN, GaN, and AlGaN are formed by the MOVPE, gas of, for example, trimethylamine (TMA) serving as a source of Al, trymethylgallium (TMG) serving as a source of Ga, and ammonia ($NH_3$) serving as a source of N, is used as source gas. The layers of AlN, GaN, and AlGaN being the nitride semiconductor layers may be each deposited by mixing the above-described source gas with a predetermined ratio in accordance with the composition of each of the nitride semiconductor layers and supplying the mixed source gas. When the nitride semiconductor layers are formed by the MOVPE for the semiconductor device according to this embodiment, the flow rate of the ammonia gas is in a range from 100 ccm to 10 LM. The pressure in the device during the deposition is in a range from 50 to 300 Torr. The grow temperature is in a range from 1000° C. to 1200° C.

Also, n-AlGaN which becomes the electron supply layer 24 is doped with Si as an impurity element which becomes n-type. More specifically, the electron supply layer 24 may be doped with Si by adding $SiH_4$ gas to the source gas at a predetermined flow rate when the electron supply layer 24 is deposited. The density of Si doped in n-AlGaN thus formed is in a range from $1\times10^{18}$ $cm^{-3}$ to $1\times10^{20}$ $cm^{-3}$, and is, for example, about $5\times10^{18}$ $cm^{-3}$. Even when, for example, n-GaN is formed as the cap layer (not illustrated), n-GaN may be formed by a method like the above-described method.

Also, p-GaN forming the p-type film 25tf is doped with Mg as an impurity element which becomes p-type. The density of doped Mg is in a range from $1\times10^{20}$ $cm^{-3}$ to $1\times10^{22}$ $cm^{-3}$, or, for example, about $1\times10^{21}$ $cm^{-3}$. Further, after the p-type film 25tf is deposited, annealing is performed at 700° C. for 30 minutes for activation. FIG. 11A is a top view of this process.

FIG. 11B is a cross-sectional view cut along dot-dash line XIB-XIB in FIG. 11A. FIG. 11C is a cross-sectional view cut along dot-dash line XIC-XIC in FIG. 11A.

Figure 12A:
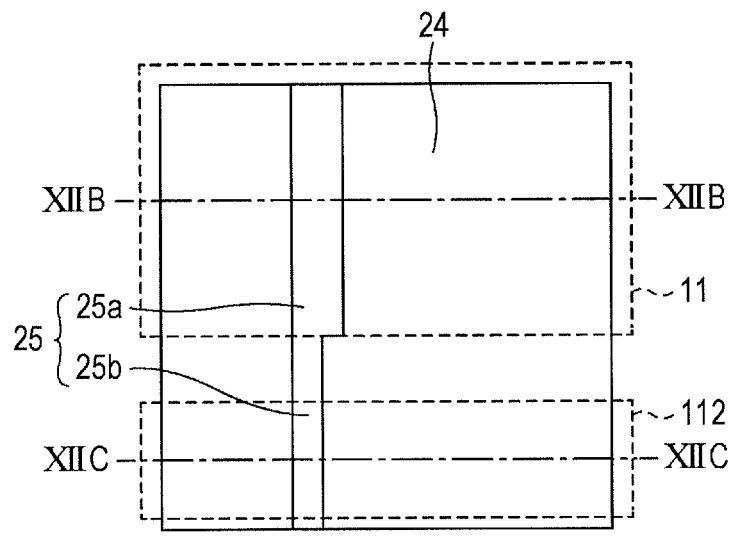
FIGS. 12A to 12C are each a process chart (2) of the manufacturing method of the semiconductor device according to the second embodiment.
Figure 12B:
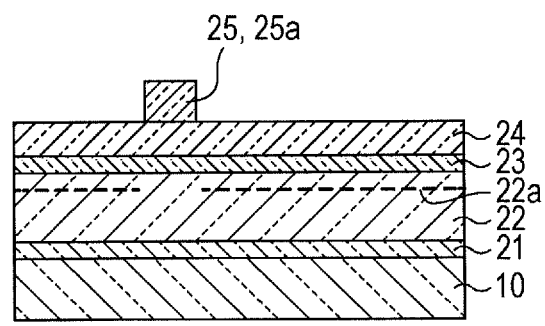
Figure 12C:
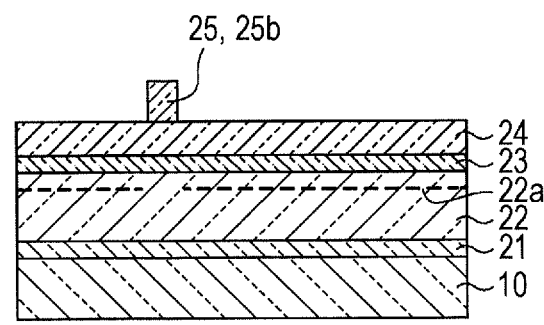

Then, as illustrated in FIGS. 12A to 12C, the p-type film 25tf is processed and thus the p-type layer 25 is formed. More specifically, a photoresist is applied on the p-type film 25tf, and the photoresist is exposed to light and developed by an exposure device. Hence, a resist pattern (not illustrated) is formed in a region where the p-type layer 25 is formed. Then, dry etching such as the RIE is performed. Hence, the p-type film 25tf in a region where the resist pattern is not formed is removed, the surface of the electron supply layer 24 is exposed, and thus the p-type layer 25 is formed of p-GaN. Then, the resist pattern (not illustrated) is removed by, for example, an organic solvent. Accordingly, the p-type layer 25 is formed in the transistor region 11 and the surge-protector region 112. As described above, the p-type layer 25 is formed such that the width of the p-type layer 25b formed in the surge-protector region 112 is smaller than the width of the p-type layer 25a formed in the transistor region 11. FIG. 12A is a top view of this process. FIG. 12B is a cross-sectional view cut along dot-dash line XIIB-XIIB in FIG. 12A. FIG. 12C is a cross-sectional view cut along dot-dash line XIIC-XIIC in FIG. 12A.

Figure 13A:
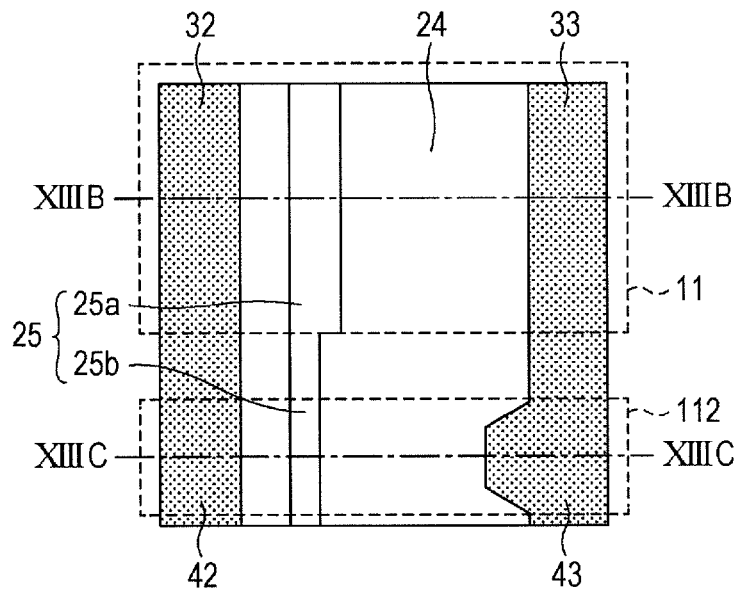
FIGS. 13A to 13C are each a process chart (3) of the manufacturing method of the semiconductor device according to the second embodiment.
Figure 13B:
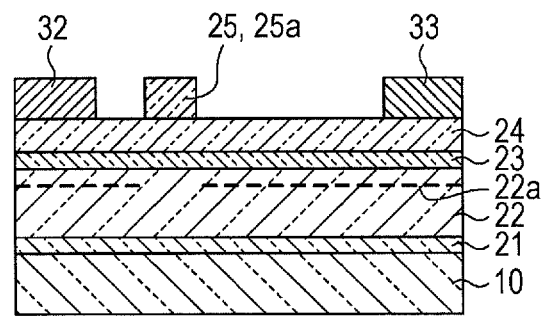
Figure 13C:
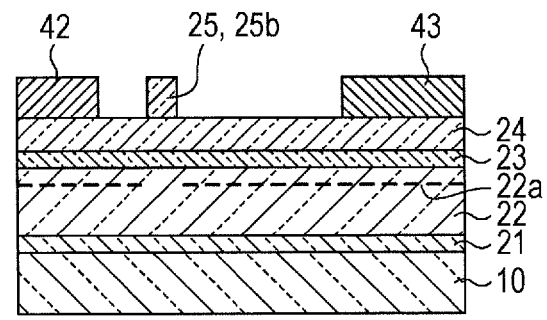

Then, as illustrated in FIGS. 13A to 13C, the source electrode 32 and the drain electrode 33 are formed on the electron supply layer 24 in the transistor region 11. The surge-protector second electrode 42 and the surge-protector third electrode 43 are formed on the electron supply layer 24 in the surge-protector region 112. More specifically, a photoresist is applied on the electron supply layer 24, and the photoresist is exposed to light and developed by an exposure device. Hence, a resist pattern (not illustrated) is formed. The resist pattern (not illustrated) has openings in regions where the source electrode 32, the drain electrode 33, the surge-protector second electrode 42, and the surge-protector third electrode 43 are formed. Then, a metal film which forms the source electrode 32, the drain electrode 33, etc., is deposited by vacuum deposition, and immersed in, for example, an organic solvent. Hence, the metal film deposited on the resist pattern is removed together with the resist pattern by lift-off. Accordingly, the remaining metal film forms the source electrode 32, the drain electrode 33, the surge-protector second electrode 42, and the surge-protector third electrode 43. Accordingly, the source electrode 32 and the surge-protector second electrode 42 are connected to each other, and are formed of the same metal material as an integrated part. The drain electrode 33 and the surge-protector third electrode 43 are connected to each other, and are formed of the same metal material as an integrated part. In this embodiment, the surge-protector third electrode 43 has a shape which protrudes to the side provided with the p-type layer 25b. FIG. 13A is a top view of this process. FIG. 13B is a cross-sectional view cut along dot-dash line XIIIB-XIIIB in FIG. 13A. FIG. 13C is a cross-sectional view cut along dot-dash line XIIIC-XIIIC in FIG. 13A.

Figure 14A:
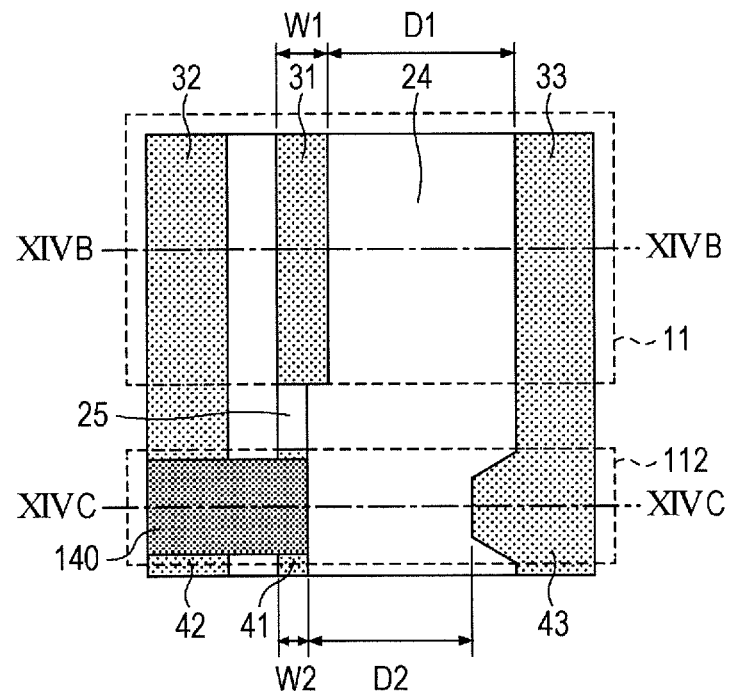
FIGS. 14A to 14C are each a process chart (4) of the manufacturing method of the semiconductor device according to the second embodiment.
Figure 14B:
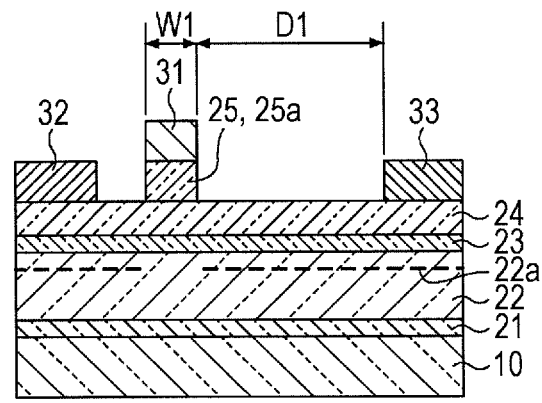
Figure 14C:
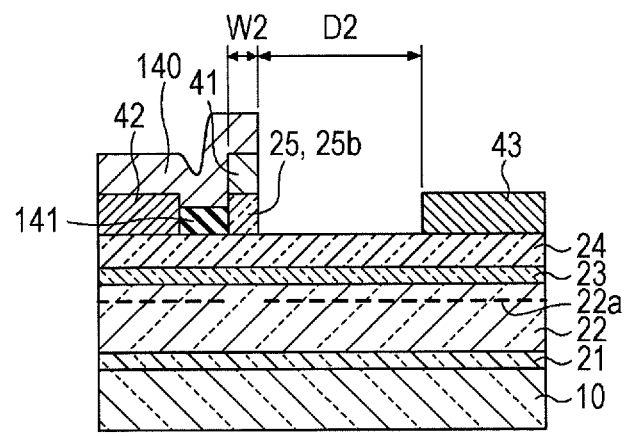

Then, as illustrated in FIGS. 14A to 14C, the gate electrode 31 is formed on the p-type layer 25 in the transistor region 11. The surge-protector first electrode 41 is formed on the p-type layer 25 in the surge-protector region 112. Further, the wiring layer 140 that connects the surge-protector first electrode 41 to the surge-protector second electrode 42 is formed. More specifically, a photoresist is applied on the electron supply layer 24 and the p-type layer 25, and the photoresist is exposed to light and developed by an exposure device. Hence, a resist pattern (not illustrated) is formed, the resist pattern having openings in regions where the gate electrode 31 and the surge-protector first electrode 41 are formed. Then, a metal film which forms the gate electrode 31 and the surge-protector first electrode 41 is deposited by vacuum deposition, and immersed in, for example, an organic solvent. Hence, the metal film deposited on the resist pattern is removed together with the resist pattern by lift-off. Accordingly, the remaining metal film forms the gate electrode 31 and the surge-protector first electrode 41. The gate electrode 31 and the surge-protector first electrode 41 formed as described above are not directly connected to each other, and are separated from each other. The width W2 of the surge-protector first electrode 41 is smaller than the width W1 of the gate electrode 31. Also, the distance D2 between the surge-protector first electrode 41 and the surge-protector third electrode 43 is smaller than the distance D1 between the gate electrode 31 and the drain electrode 33.

Then, an insulating film 141 is formed on the electron supply layer 24 in a region where the wiring layer 140 is formed. Then, a photoresist is further applied on the surge-protector first electrode 41, the surge-protector second electrode 42, etc., and the photoresist is exposed to light and developed by an exposure device. Hence, a resist pattern (not illustrated) is formed, the resist pattern having an opening in a region where the wiring layer 140 is formed. Then, a metal film which forms the wiring layer 140 is deposited by vacuum deposition, and immersed in, for example, an organic solvent. Hence, the metal film deposited on the resist pattern is removed together with the resist pattern by lift-off. Accordingly, the remaining metal film forms the wiring layer 140. The wiring layer 140 formed as described above electrically connects the surge-protector first electrode 41 and the surge-protector second electrode 42 to each other. In the above description, the surge-protector first electrode 41 etc. and the wiring layer 140 are formed in different processes; however, the surge-protector first electrode 41 etc. and the wiring layer 140 may be simultaneously formed in the same process. FIG. 14A is a top view of this process. FIG. 14B is a cross-sectional view cut along dot-dash line XIVB-XIVB in FIG. 14A. FIG. 14C is a cross-sectional view cut along dot-dash line XIVC-XIVC in FIG. 14A.

The semiconductor device according to this embodiment is fabricated by the above-described manufacturing method. Additionally, an insulating film (not illustrated) may be formed on the gate electrode 31, the source electrode 32, the drain electrode 33, etc. This insulating film serves as a passivation film. The insulating film may be formed by depositing an insulating material, such as $SiO_2$ or SiN, by, for example, the plasma CVD.

As described above, the semiconductor device may be manufactured by the manufacturing method of the semiconductor device according to this embodiment.

Experimental Results

Next, the results of evaluations for electrical characteristics of the semiconductor device according to this embodiment and a semiconductor device with a conventional structure are described. The semiconductor device with the conventional structure has a structure in which the surge-protector region 112 is not formed in the semiconductor device illustrated in FIGS. 8, and 9A and 9B, i.e., a structure in which only the transistor region 11 is formed.

Figure 15:
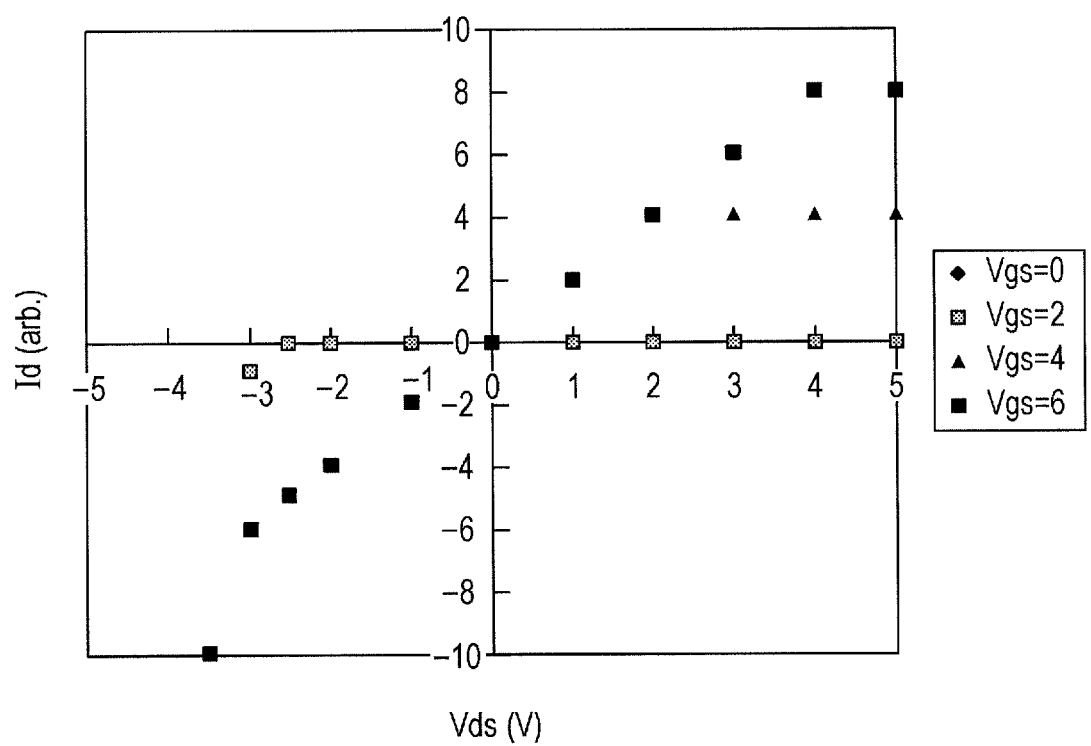
FIG. 15 is a correlation diagram (1) of the drain-source voltage and the drain current of the semiconductor device according to the second embodiment.
Figure 16:
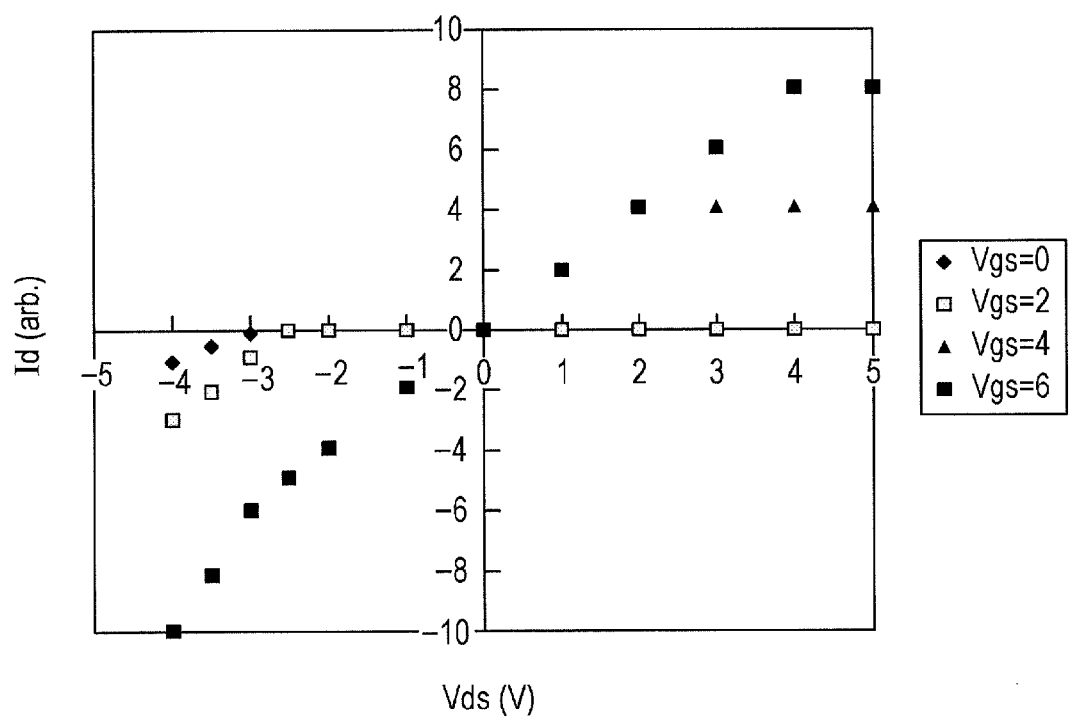
FIG. 16 is a correlation diagram (1) of the drain-source voltage and the drain current of a semiconductor device with a structure of related art.

Described first is the relationship between the drain-source voltage Vds and the drain current Id when the gate-source voltage Vgs is changed in each of the semiconductor device according to this embodiment and the semiconductor device with the conventional structure. FIG. 15 illustrates the relationship between the drain-source voltage and the drain current of the semiconductor device according to this embodiment. FIG. 16 illustrates the relationship between the drain-source voltage and the drain current of the semiconductor device with the conventional structure. As illustrated in FIGS. 15 and 16, if the drain-source voltage Vds is positive, the drain current Id flowing in the semiconductor device according to this embodiment and the drain current Id flowing in the semiconductor device with the conventional structure are substantially the same. However, if the drain-source voltage Vds is negative, in a range where the drain-source voltage Vds is −3.5 V or lower, the amount of the drain current Id flowing in the semiconductor device according to this embodiment is larger than the amount of the drain current Id flowing in the semiconductor device with the conventional structure. In FIG. 15, the drain current Id is not plotted if the drain-source voltage Vds is −4 V etc., because the drain current Id flows by an amount exceeding the illustrated range. As described above, the semiconductor device according to this embodiment operates like a diode without depending on the potential of the gate electrode 31 if the drain-source voltage Vds becomes lower than a predetermined value. That is, the operation like a diode is made if the absolute value of the drain-source voltage Vds becomes larger than the absolute value of the predetermined value.

Figure 17:
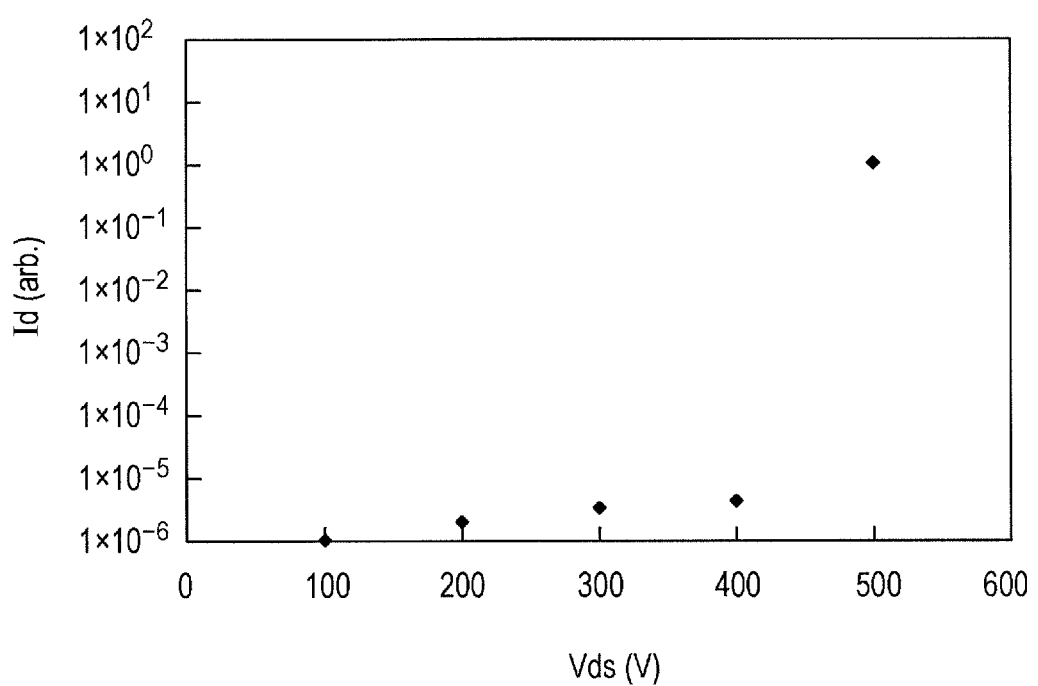
FIG. 17 is a correlation diagram (2) of the drain-source voltage and the drain current of the semiconductor device according to the second embodiment.
Figure 18:
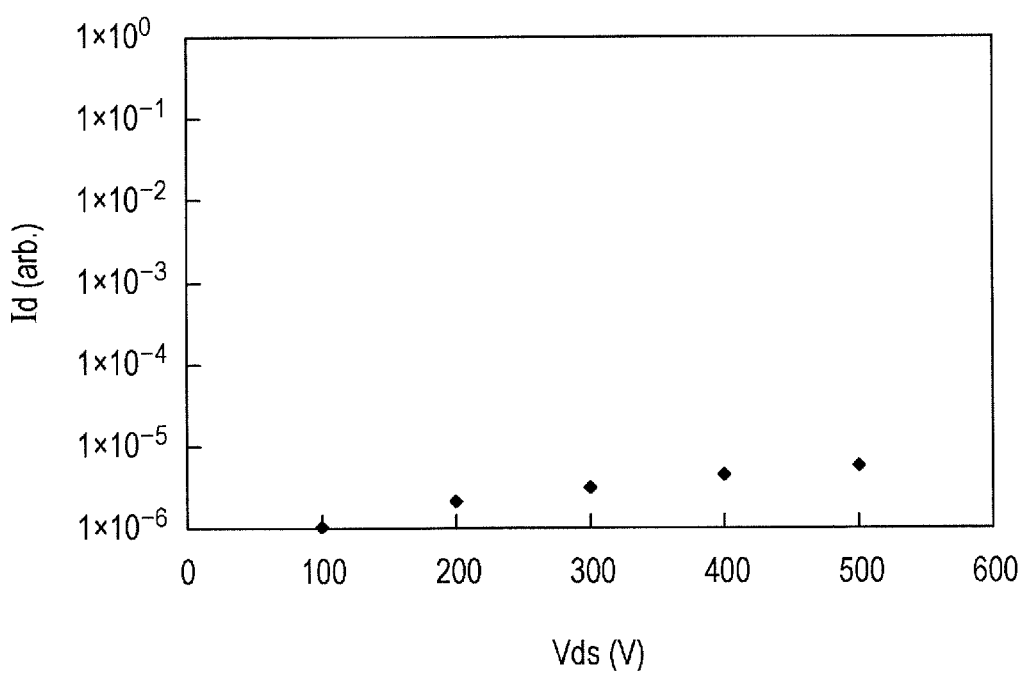
FIG. 18 is a correlation diagram (2) of the drain-source voltage and the drain current of the semiconductor device with the structure of related art.

Described next is the relationship between the drain-source voltage Vds and the drain current Id if the gate-source voltage Vgs is 0 V in each of the semiconductor device according to this embodiment and the semiconductor device with the conventional structure. FIG. 17 illustrates the relationship between the drain-source voltage and the drain current of the semiconductor device according to this embodiment. FIG. 18 illustrates the relationship between the drain-source voltage and the drain current of the semiconductor device with the conventional structure. As illustrated in FIG. 17, the drain current Id flows by a large amount in the semiconductor device according to this embodiment if the drain-source voltage Vds is 500 V; however, a breakdown or the like does not occur. As described above, in the semiconductor device according to this embodiment, leak current is rapidly increased if the drain-source voltage Vds is about 500 V possibly because current flows in the surge-protector region 112. Thus, it is conceived that the transistor region 11 of the semiconductor device according to this embodiment is protected. In other words, in the semiconductor device according to this embodiment, if the drain-source voltage Vds becomes about 500 V or higher, the leak current flows in the surge-protector region 112. Hence, the transistor region 11 is not broken.

In contrast, in the semiconductor device with the conventional structure, even if the drain-source voltage Vds becomes 500 V, the drain current Id is not noticeably increased. This is because the surge-protector region 112 of this embodiment is not formed in the semiconductor device with the conventional structure. The drain current Id does not flow even if the drain-source voltage Vds is about 500 V. Accordingly, in the semiconductor device with the conventional structure, if a high drain-source voltage Vds is applied, the semiconductor device may be broken with the voltage.

As described above, the semiconductor device according to this embodiment is hardly broken and has increased reliability as compared with the semiconductor device with the conventional structure, even if a high voltage is applied between the drain and the source.

Third Embodiment

Next, a third embodiment is described. This embodiment has a structure in which the p-type layer 25 is not formed in the semiconductor device according to the first embodiment.

Since the p-type layer 25 is formed in the semiconductor device according to the first embodiment, the semiconductor device is normally turned OFF. In contrast, in the semiconductor device according to this embodiment, a predetermined negative voltage has to be applied to the gate electrode 31 to turn OFF the semiconductor device.

Figure 19:
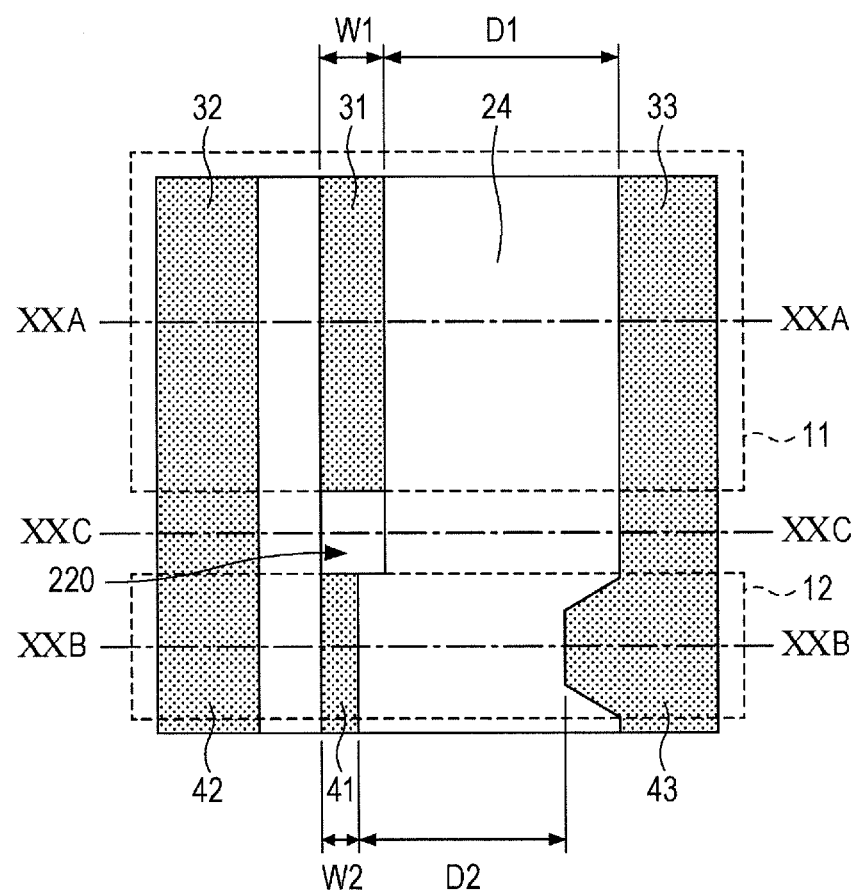
FIG. 19 is a top view of a semiconductor device according to a third embodiment.
Figure 20A:
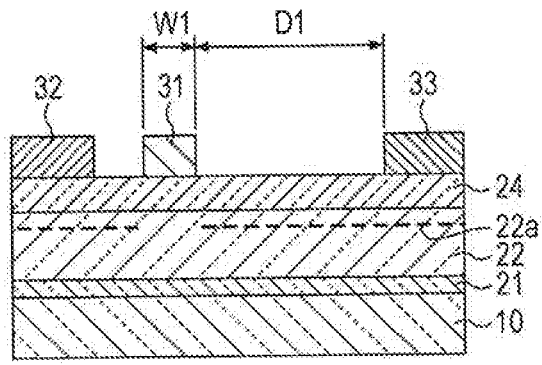
FIGS. 20A to 20C are each a cross-sectional view of the semiconductor device according to the third embodiment.
Figure 20B:
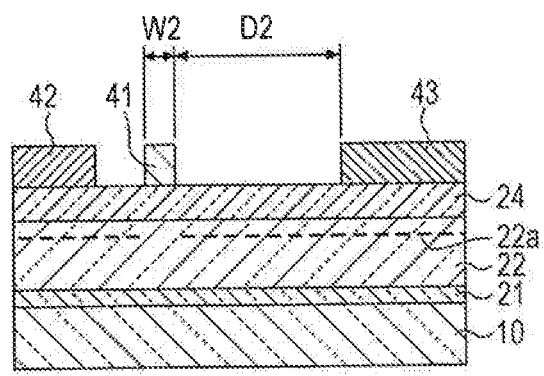
Figure 20C:
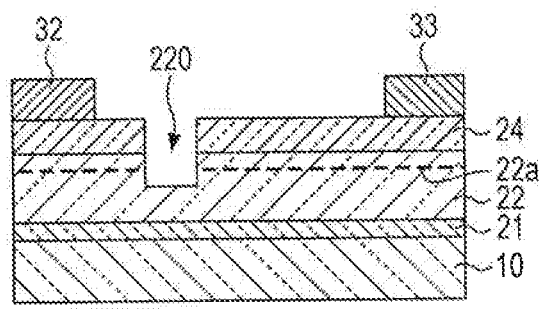

A semiconductor device according to this embodiment is described with reference to FIGS. 19, and 20A to 20C. FIG. 19 is a top view of the semiconductor device according to this embodiment. FIG. 20A is a cross-sectional view cut along dot-dash line XXA-XXA in FIG. 19. FIG. 20B is a cross-sectional view cut along dot-dash line XXB-XXB in FIG. 19. FIG. 20C is a cross-sectional view cut along dot-dash line XXC-XXC in FIG. 19. The semiconductor device according this embodiment has a transistor region 11 that functions as a transistor, and a surge-protector region 12 that functions as a surge protector.

In the semiconductor device according to this embodiment, an electron supply layer 24 and an electron transit layer 22 are partly removed by etching or the like in a region between a region where a gate electrode 31 is formed and a region where a surge-protector first electrode 41 is formed, and a recess 220 is formed. Accordingly, a structure is provided in which current does not flow although a negative voltage is not applied.

In the semiconductor device according to this embodiment, a buffer layer 21, an electron transit layer 22, and the electron supply layer 24 formed of nitride semiconductors are formed on the substrate 10. The buffer layer 21 is formed of, for example, AlN. The electron transit layer 22 is formed of, for example, i-GaN. The electron supply layer 24 is formed of, for example, n-AlGaN. Hence, 2DEG 22a is formed in the electron transit layer 22, at a position near the interface between the electron transit layer 22 and the electron supply layer 24. The 2DEG 22a formed as described above is generated in accordance with a difference in lattice constant between the electron transit layer 22 formed of GaN and the electron supply layer 24 formed of AlGaN. The semiconductor device according to this embodiment may have a structure in which a cap layer (not illustrated) is formed on the electron supply layer 24. Also, an intermediate layer formed of, for example, i-AlGaN may be provided between the electron transit layer 22 and the electron supply layer 24. In this case, the 2DEG 22a may be formed in the intermediate layer.

In the semiconductor device according to this embodiment, the gate electrode 31, a source electrode 32, and a drain electrode 33 are formed on the electron supply layer 24 in the transistor region 11. Also, the surge-protector first electrode 41, a surge-protector second electrode 42, and a surge-protector third electrode 43 are formed on the electron supply layer 24 in the surge-protector region 12. The surge-protector first electrode 41 and the gate electrode 31 are not directly electrically connected to each other. The surge-protector second electrode 42 and the source electrode 32 are directly electrically connected to each other. The surge-protector third electrode 43 and the drain electrode 33 are directly electrically connected to each other.

Also, the semiconductor device according to this embodiment may be manufactured by a manufacturing method in which the process of forming the p-type film 25tf and the p-type layer 25 is omitted from the manufacturing method of the semiconductor device according to the first embodiment.

The contents other than the contents described above are equivalent to those of the first embodiment.

Fourth Embodiment

Next, a fourth embodiment is described. This embodiment provides a semiconductor device unit, a power supply device, and a high-frequency amplifier.

Figure 21:
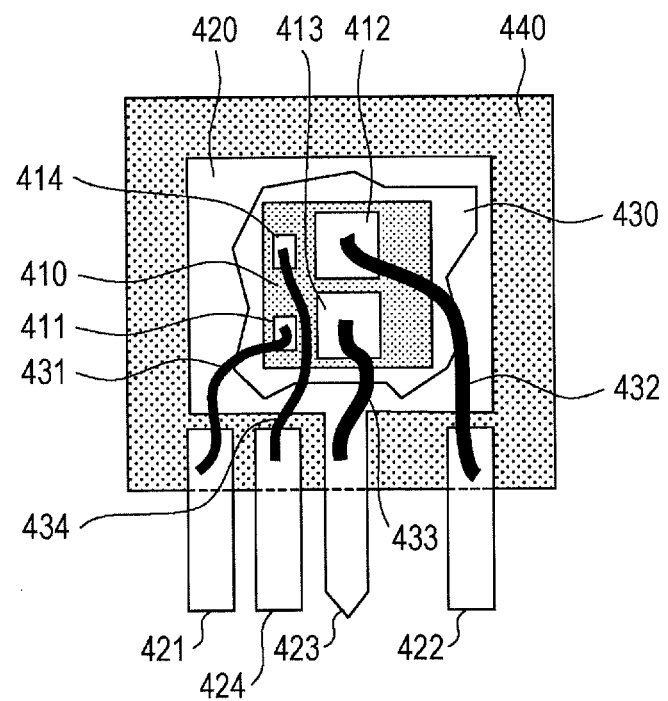
FIG. 21 is an explanatory view (1) of a semiconductor device according to a fourth embodiment.
Figure 22:
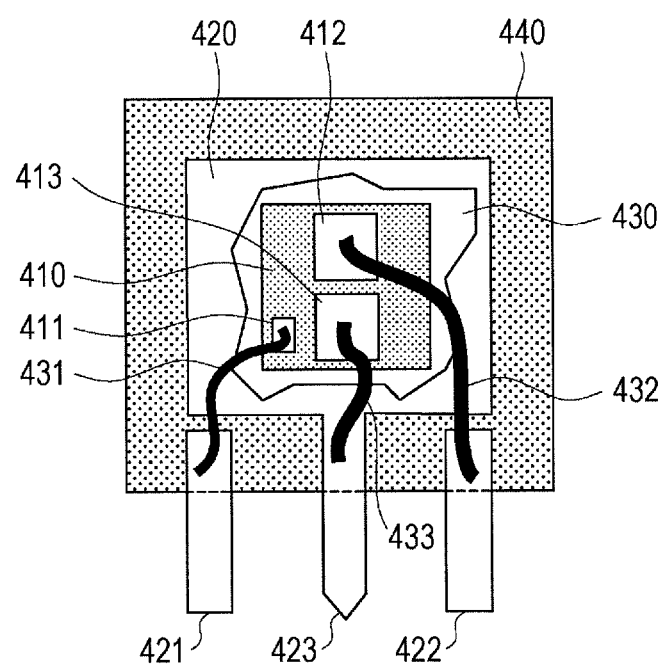
FIG. 22 is an explanatory view (2) of the semiconductor device according to the fourth embodiment.

The semiconductor device unit according to this embodiment is formed by packaging any of the semiconductor devices according to the first to third embodiments by discrete packaging. Such a discrete packaged semiconductor device unit is described with reference to FIGS. 21 and 22. FIGS. 21 and 22 each schematically illustrate the inside of a discrete packaged semiconductor device, and arrangement etc. of electrodes is different from that of any of the first to third embodiments.

Semiconductor Device Unit 1

FIG. 21 illustrates a discrete package including the semiconductor device according to the first or third embodiment.

First, a semiconductor chip 410, which is an HEMT formed of a GaN-base semiconductor material, is formed by cutting the semiconductor devices manufactured in the first or third embodiment, by dicing etc. The semiconductor chip 410 is fixed on a reed frame 420 with a die-attach agent 430 such as solder. The semiconductor chip 410 corresponds to the semiconductor device according to the first or third embodiment.

Then, a gate electrode 411 is connected to a gate reed 421 through a bonding wire 431, a source electrode 412 is connected to a source reed 422 through a bonding wire 432, and a drain electrode 413 is connected to a drain reed 423 through a bonding wire 433. Also, a surge-protector first electrode 414 is connected to a surge-protector reed 424 through a bonding wire 434. The bonding wires 431, 432, 433, and 434 are formed of a metal material, for example, Al. Also, in this embodiment, the gate electrode 411 is a kind of gate electrode pad, and is connected to the gate electrode 31 of the semiconductor device according to the first or third embodiment. The source electrode 412 is a kind of source electrode pad, and is connected to the source electrode 32 of the semiconductor device according to the first or third embodiment. The drain electrode 413 is a kind of drain electrode pad, and is connected to the drain electrode 33 of the semiconductor device according to the first or third embodiment. The surge-protector first electrode 414 is a kind of surge-protector electrode pad, and is connected to the surge-protector first electrode 41 of the semiconductor device according to the first or third embodiment.

Then, resin sealing is performed with mold resin 440 by transfer molding. In this way, the discrete packaged semiconductor device unit of the HEMT using the GaN-base semiconductor material may be fabricated.

Semiconductor Device Unit 2

FIG. 22 illustrates a discrete package including the semiconductor device according to the second embodiment.

First, a semiconductor chip 410, which is an HEMT formed of a GaN-base semiconductor material, is formed by cutting the semiconductor devices manufactured in the second embodiment, by dicing etc. The semiconductor chip 410 is fixed on a reed frame 420 with a die-attach agent 430 such as solder. The semiconductor chip 410 corresponds to the semiconductor device according to the second embodiment.

Then, a gate electrode 411 is connected to a gate reed 421 through a bonding wire 431, a source electrode 412 is connected to a source reed 422 through a bonding wire 432, and a drain electrode 413 is connected to a drain reed 423 through a bonding wire 433. The bonding wires 431, 432, and 433 are formed of a metal material, for example, Al. Also, in this embodiment, the gate electrode 411 is a kind of gate electrode pad, and is connected to the gate electrode 31 of the semiconductor device according to the second embodiment. The source electrode 412 is a kind of source electrode pad, and is connected to the source electrode 32 of the semiconductor device according to the second embodiment. The drain electrode 413 is a kind of drain electrode pad, and is connected to the drain electrode 33 of the semiconductor device according to the second embodiment.

Then, resin sealing is performed with mold resin 440 by transfer molding. In this way, the discrete packaged semiconductor device unit of the HEMT using the GaN-base semiconductor material may be fabricated.

PFC Circuit, Power Supply Device, and High-frequency Amplifier

Next, a PFC circuit, a power supply device, and a high-frequency amplifier according to this embodiment are described. The PFC circuit, the power supply device, and the high-frequency amplifier according to this embodiment are a PFC circuit, a power supply device, and a high-frequency amplifier, respectively, each using the semiconductor device according to the first or second embodiment.

PFC Circuit

The PFC circuit according to this embodiment is described. The PFC circuit according to this embodiment includes the semiconductor device according to the first or second embodiment.

Figure 23:
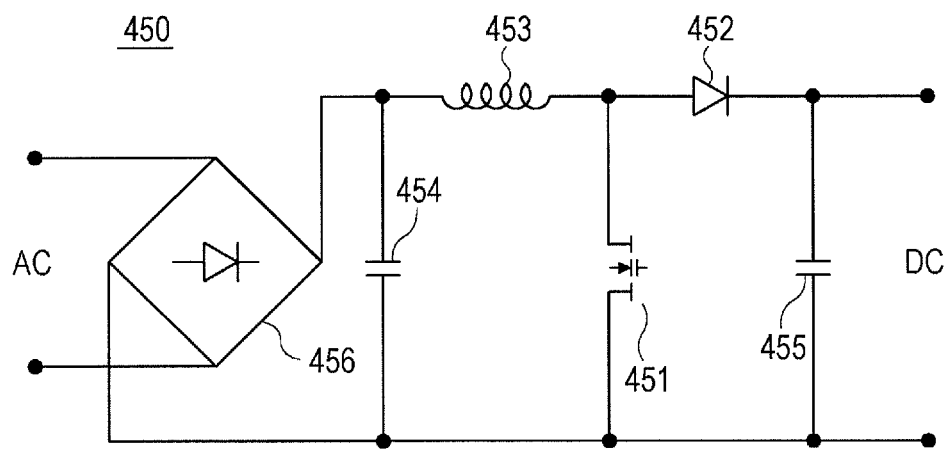
FIG. 23 is a circuit diagram of a PFC circuit according to the fourth embodiment.

The PFC circuit according to this embodiment is described with reference to FIG. 23. A PFC circuit 450 according to this embodiment includes a switching element (a transistor) 451, a diode 452, a choke coil 453, capacitors 454 and 455, a diode bridge 456, and an alternating-current power supply (not illustrated). The switching element 451 uses an HEMT, which is the semiconductor device according to the first or second embodiment, formed of AlGaN or GaN.

In the PFC circuit 450, a drain electrode of the switching element 451 is connected to an anode terminal of the diode 452 and to one terminal of the choke coil 453. Also, a source electrode of the switching element 451 is connected to one terminal of the capacitor 454 and to one terminal of the capacitor 455. The other terminal of the capacitor 454 is connected to the other terminal of the choke coil 453. The other terminal of the capacitor 455 is connected to a cathode terminal of the diode 452. The alternating-current power supply (not illustrated) is connected between both the terminals of the capacitor 454 through the diode bridge 456. In the PFC circuit 450, direct current (DC) is output between both the terminals of the capacitor 455.

The PFC circuit according to this embodiment uses the semiconductor device according to the first or second embodiment, which is hardly broken even if a surge voltage is generated. Accordingly, reliability of the PFC circuit may be increased.

Experimental Results

Next, a situation, in which a surge voltage is applied to the PFC circuit or the like, in each of the semiconductor device according to the second embodiment and the semiconductor device with the conventional structure is described with reference to FIGS. 24 and 25. The semiconductor device according to the second embodiment is the semiconductor device illustrated in FIGS. 8, and 9A and 9B. The semiconductor device with the conventional structure has a structure in which the surge-protector region 112 is not formed in the semiconductor device illustrated in FIGS. 8, and 9A and 9B.

Figure 24:
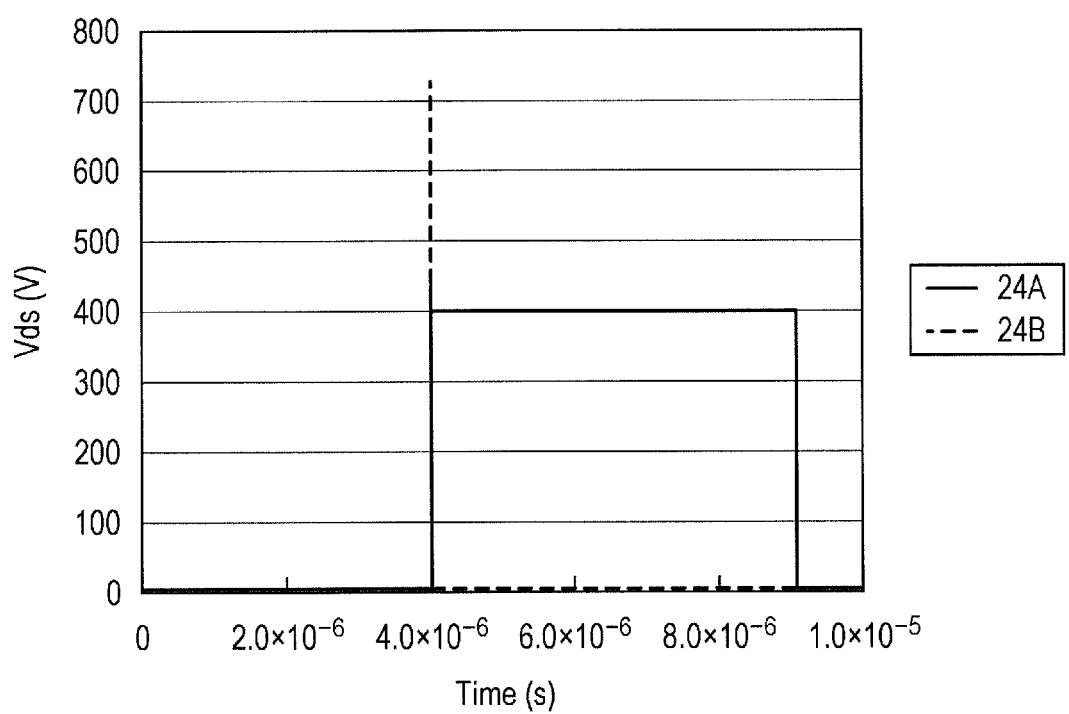
FIG. 24 is a characteristic diagram of a change in drain-source voltage with time of a semiconductor device.
Figure 25:
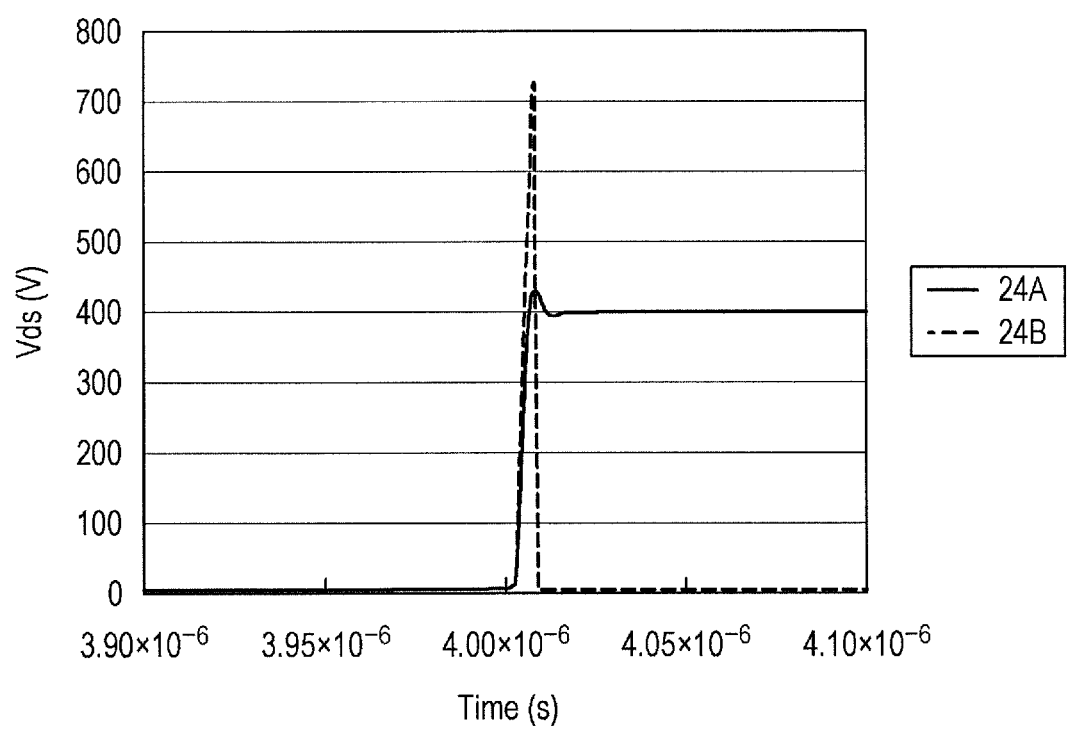
FIG. 25 is an enlarged view of the characteristic of the change in drain-source voltage with time of the semiconductor device.

Also, FIGS. 24 and 25 each illustrate a change in drain-source voltage Vds with time in the semiconductor device if a surge voltage is applied. FIG. 25 is an enlarged view of part of FIG. 24. In FIGS. 24 and 25, reference sign 24A denotes the characteristics of the semiconductor device according to the second embodiment, and reference sign 24B denotes the characteristics of the semiconductor device with the conventional structure. As indicated by reference sign 24A, current flows in the surge-protector region 112 in the semiconductor device according to the second embodiment if Vds is about 400 V. Accordingly, a surge is suppressed and the HEMT in the transistor region 11 is protected. In contrast, as indicated by reference sign 24B, since the semiconductor device with the conventional structure does not have an element corresponding to the surge protector, a surge is not suppressed, a surge voltage exceeding a breakdown voltage of the HEMT is applied, and hence the HEMT is broken with the surge voltage. As described above, a breakdown of the semiconductor device according to the second embodiment because of a surge voltage or the like may be suppressed. The semiconductor device according to the second embodiment is described above; however, the semiconductor device according to the first embodiment may exhibit equivalent results.

Power Supply Device

Next, the power supply device according to this embodiment is described. The power supply device according to this embodiment is a power supply device including an HEMT formed of AlGaN or GaN, the HEMT which is the semiconductor device according to the first or second embodiment.

Figure 26:
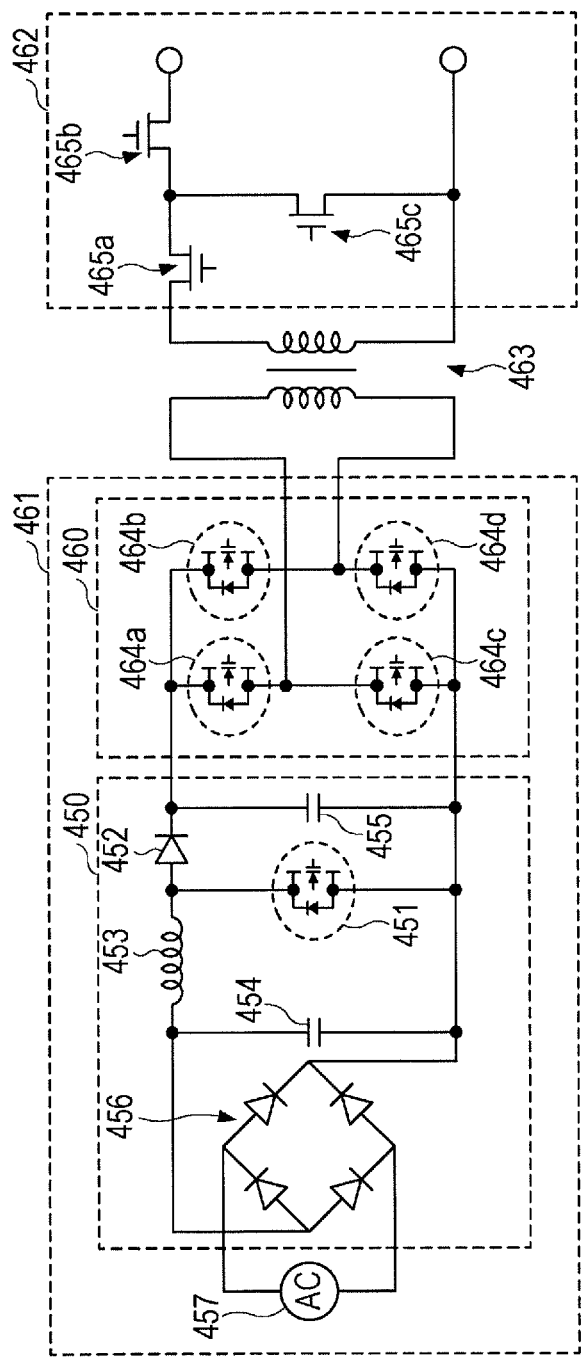
FIG. 26 is a circuit diagram of a power supply device according to the fourth embodiment.

The power supply device according to this embodiment is described with reference to FIG. 26. The power supply device according to this embodiment has a structure including the above-described PFC circuit 450 according to this embodiment.

The power supply device according to this embodiment includes a high-voltage first circuit 461, a low-voltage second circuit 462, and a transformer 463 arranged between the first circuit 461 and the second circuit 462.

The first circuit 461 includes the above-described PFC circuit 450 according to this embodiment, and an inverter circuit, for example, a full-bridge inverter circuit 460, connected between both the terminals of the capacitor 455 of the PFC circuit 450. The full-bridge inverter circuit 460 has a plurality of (herein, four) switching elements 464a, 464b, 464c, and 464d. The second circuit 462 has a plurality of (herein, three) switching elements 465a, 465b, and 465c. An alternating-current power supply 457 is connected to the diode bridge 456.

In this embodiment, the switching element 451 of the PFC circuit 450 in the first circuit 461 uses an HEMT formed of AlGaN or GaN, the HEMT which is the semiconductor device according to the first or second embodiment. Further, each of the switching elements 464a, 464b, 464c, and 464d in the full-bridge inverter circuit 460 uses an HEMT formed of AlGaN or GaN, the HEMT which is the semiconductor device according to the first or second embodiment. In contrast, each of the switching elements 465a, 465b, and 465c in the second circuit 462 uses an FET having a normal metal insulator semiconductor (MIS) structure using silicon.

As described above, this embodiment is formed by using the semiconductor device according to the first or second embodiment. Hence, in the first circuit 461, even if a surge voltage is generated in the switching elements 451, 464a, 464b, 464c, and 464d, a breakdown of any of the switching elements 451, 464*a*, 464*b*, 464*c*, and 464*d* is suppressed by a rectification action of a protective diode. As describe above, since a large avalanche capacity is ensured, the large avalanche capacity makes a large contribution to stabilization of the device operation.

As described above, the power supply device according to this embodiment uses the semiconductor device according to the first or second embodiment with a high device speed, a large avalanche capacity, a high resistance to a surge, and high reliability. Accordingly, the reliability etc. of the power supply device may be increased. Also, since the semiconductor device according to the first or second embodiment does not have to use an external circuit, the power supply device according to this embodiment may be decreased in size.

High-Frequency Amplifier

Next, the high-frequency amplifier according to this embodiment is described. The high-frequency amplifier according to this embodiment has a structure using an HEMT formed of AlGaN or GaN, the HEMT which is the semiconductor device according to the first or second embodiment.

Figure 27:
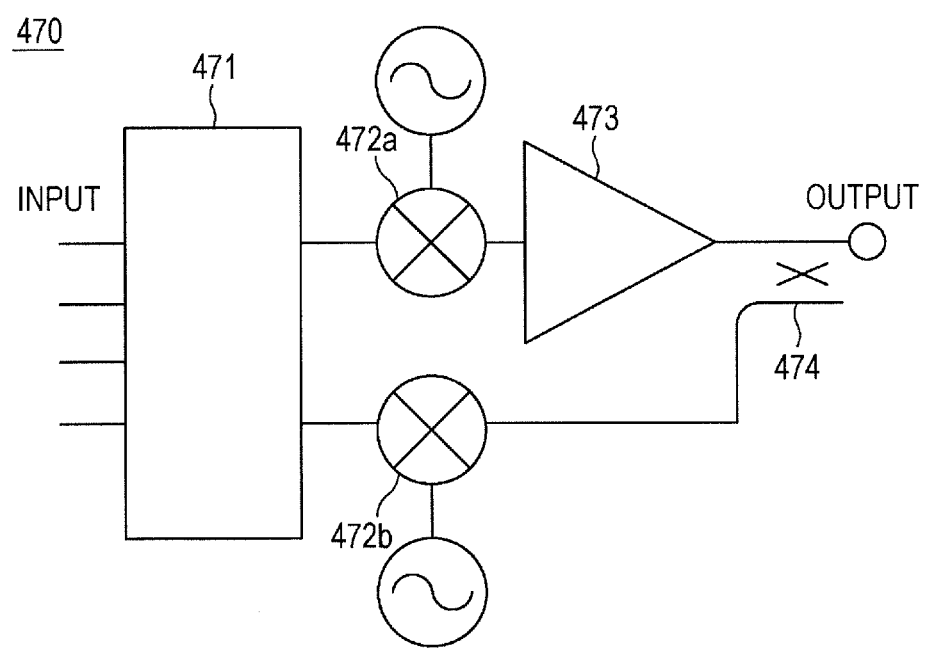
FIG. 27 is a structure diagram of a high-power amplifier according to the fourth embodiment.

The high-frequency amplifier according to this embodiment is described with reference to FIG. 27. The high-frequency amplifier 470 according to this embodiment includes a digital predistortion circuit 471, mixers 472*a* and 472*b*, a power amplifier 473, and a directional coupler 474.

The digital predistortion circuit 471 compensates a nonlinear distortion of an input signal. The mixer 472*a* mixes an alternating current signal with the input signal with the nonlinear distortion compensated. The power amplifier 473 amplifies the input signal mixed with the alternating current signal, and includes an HEMT, which is the semiconductor device according to the first or second embodiment, formed of AlGaN or GaN. The directional coupler 474 monitors the input and output signals. In FIG. 27, the output signal may be mixed with the alternating current signal at the mixer 472*b* and sent to the digital predistortion circuit 471, for example, by selection of a switch.

The high-frequency amplifier according to this embodiment uses the semiconductor device according to the first or second embodiment with a high device speed, a large avalanche capacity, a high resistance to a surge, and high reliability. Accordingly, reliability of the high-frequency amplifier may be increased. Also, since the semiconductor device according to the first or second embodiment does not have to use an external circuit, the high-frequency amplifier according to this embodiment may be decreased in size.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device that has a transistor region and a surge-protector region, comprising:
   a substrate;
   a first semiconductor layer formed on the substrate;
   a second semiconductor layer formed on the first semiconductor layer;
   a third semiconductor layer formed on the second semiconductor layer;
   a gate electrode formed on the third semiconductor layer in the transistor region;
   a source electrode and a drain electrode formed on the second semiconductor layer in the transistor region, a whole bottom of the source electrode, and a whole bottom of the drain electrode contacting with the second semiconductor layer;
   a surge-protector first electrode formed on the third semiconductor layer in the surge protection region;
   a surge-protector second electrode, and a surge-protector third electrode formed on the second semiconductor layer in the surge-protector region, a whole bottom of the surge-protector second electrode, and a whole bottom of the surge-protector third electrode contacting with the second semiconductor layer,
   wherein the source electrode and the surge-protector second electrode are connected to each other,
   wherein the drain electrode and the surge-protector third electrode are connected to each other,
   wherein the surge-protector first electrode is formed between the surge-protector second electrode and the surge-protector third electrode,
   wherein a distance between the surge-protector first electrode and the surge-protector third electrode is smaller than a distance between the gate electrode and the drain electrode, and
   wherein the width of the third semiconductor layer under the gate electrode is wider than the width of the third semiconductor layer under the surge-protector first electrode.

2. The semiconductor device according to claim 1, wherein the first semiconductor layer and the second semiconductor layer are nitride semiconductors.

3. The semiconductor device according to claim 1, wherein an electron is generated at a position near an interface between the first semiconductor layer and the second semiconductor layer.

4. The semiconductor device according to claim 1, wherein the third semiconductor layer is a nitride semiconductor.

5. The semiconductor device according to claim 1,
   wherein an electron is generated in the first semiconductor layer at a position near the interface between the first semiconductor layer and the second semiconductor layer, and
   wherein the third semiconductor layer is p-type.

6. The semiconductor device according to claim 1, wherein the third semiconductor layer is formed of a material containing gallium nitride.

7. The semiconductor device according to claim 1, wherein the first semiconductor layer, the second semiconductor layer, and the third semiconductor layer are formed by epitaxial growth.

8. The semiconductor device according to claim 1, wherein the surge-protector first electrode has a smaller gate length than a gate length of the gate electrode.

9. The semiconductor device according to claim 1, wherein the surge-protector first electrode and the surge-protector second electrode are connected to each other.

10. The semiconductor device according to claim 1, wherein the first semiconductor layer is formed of a material containing gallium nitride.

11. The semiconductor device according to claim 1, wherein the second semiconductor layer is formed of a material containing aluminum gallium nitride.

12. The semiconductor device according to claim 1, wherein the second semiconductor layer is n-type.

13. The semiconductor device according to claim 1, further comprising:
- an intermediate layer formed between the first semiconductor layer and the second semiconductor layer,
- wherein the intermediate layer is formed of a material containing aluminum gallium nitride.

14. The semiconductor device according to claim 1, further comprising:
- a buffer layer formed between the substrate and the first semiconductor layer,
- wherein the buffer layer is formed of a material containing aluminum nitride, and
- wherein the substrate is formed of any of silicon, sapphire, and silicon carbide.

15. The semiconductor device according to claim 1, wherein the semiconductor device includes a high-electron-mobility transistor.

* * * * *